(12) United States Patent
Yamasaki et al.

(10) Patent No.: US 7,754,302 B2
(45) Date of Patent: Jul. 13, 2010

(54) DLC FILM COATED PLASTIC CONTAINER, AND DEVICE AND METHOD FOR MANUFACTURING THE PLASTIC CONTAINER

(75) Inventors: Teruyuki Yamasaki, Tokyo (JP); Akira Shirakura, Tokyo (JP); Hideyasu Ando, Tokyo (JP)

(73) Assignee: Kirin Brewery Company, Limted, Tokyo (JP)

( * ) Notice: Subject to any disclaimer, the term of this patent is extended or adjusted under 35 U.S.C. 154(b) by 950 days.

(21) Appl. No.: 10/514,728

(22) PCT Filed: May 26, 2003

(86) PCT No.: PCT/JP03/06528

§ 371 (c)(1),
(2), (4) Date: Jul. 27, 2005

(87) PCT Pub. No.: WO03/101847

PCT Pub. Date: Dec. 11, 2003

(65) Prior Publication Data

US 2006/0051539 A1 Mar. 9, 2006

(30) Foreign Application Priority Data

May 28, 2002 (JP) .............................. 2002-154697

(51) Int. Cl.
*B32B 27/08* (2006.01)
*C23C 16/00* (2006.01)
(52) U.S. Cl. .................... 428/35.7; 427/577; 427/237; 220/62.12; 220/62.22
(58) Field of Classification Search ................ 427/230, 427/238, 902, 906, 577, 237; 215/12.2, DIG. 14; 428/35.7, 408, 216, 212
See application file for complete search history.

(56) References Cited

U.S. PATENT DOCUMENTS 4,667,620 A * 5/1987 White ....................... 118/50.1

(Continued)

FOREIGN PATENT DOCUMENTS

EP 1 010 773 A1 6/2000

(Continued)

OTHER PUBLICATIONS

U.S. Appl. No. 10/514,729, filed Nov. 24, 2004, Yamasaki, et al.

(Continued)

*Primary Examiner*—Rena L Dye
*Assistant Examiner*—Michele Jacobson
(74) *Attorney, Agent, or Firm*—Oblon, Spivak, McClelland, Maier & Neustadt, L.L.P.

(57) ABSTRACT

The present invention provides a plastic container or bottle having an inner wall surface coated with a DLC film which has the same level of oxygen barrier property as prior art DLC coated containers while at the same time preventing the coloration of the neck portion found in the containers of the prior art. The DLC film formed on the neck portion of the inventive bottle has a lower graphite mixing proportion than the DLC film formed on body portion, and the oxygen permeability of the container is less than or equal to 0.0050 ml/container (500 ml PET container)/day. The apparatus and the method of producing such a bottle are also described.

6 Claims, 21 Drawing Sheets

U.S. PATENT DOCUMENTS

| | | | | |
|---|---|---|---|---|
| 4,746,538 | A | * | 5/1988 | Mackowski .................. 427/577 |
| 5,798,139 | A | * | 8/1998 | Nagashima et al. .......... 427/237 |
| 5,885,672 | A | * | 3/1999 | Phillips et al. ............. 428/35.2 |
| 6,045,916 | A | * | 4/2000 | Shimamura et al. ......... 428/408 |
| 6,180,191 | B1 | * | 1/2001 | Felts ........................... 427/569 |
| 6,503,579 | B1 | * | 1/2003 | Murakami et al. ........... 427/577 |
| 6,589,619 | B1 | * | 7/2003 | Nagashima ................. 428/36.6 |
| 6,805,931 | B2 | * | 10/2004 | Nagashima ................. 428/36.6 |
| 6,919,114 | B1 | * | 7/2005 | Darras et al. ............... 428/36.7 |
| 7,029,752 | B2 | * | 4/2006 | Hama et al. ................. 428/408 |
| 7,166,336 | B1 | * | 1/2007 | Mori et al. .................. 427/577 |
| 2003/0087030 | A1 | * | 5/2003 | Hama et al. ................. 427/209 |
| 2003/0124229 | A1 | * | 7/2003 | Hama et al. ................. 426/106 |
| 2005/0118365 | A1 | * | 6/2005 | Miyazaki et al. ............ 428/34.1 |
| 2006/0051539 | A1 | * | 3/2006 | Yamasaki et al. .......... 428/35.7 |

FOREIGN PATENT DOCUMENTS

| | | |
|---|---|---|
| EP | 1 197 581 | 4/2002 |
| JP | 08-053117 | 2/1996 |
| JP | 2001-31045 | 2/2001 |
| JP | 2001-335947 | 12/2001 |
| WO | WO 9949991 A1 * | 10/1999 |
| WO | WO 01/32513 A1 | 5/2001 |
| WO | 03 102263 | 12/2003 |

OTHER PUBLICATIONS

T. Tanaka, et al. "Diamondlike carbon deposition on plastic films by plasma source ion implantation", Journal of Vacuum Science and Technology, Part A, vol. 20, No. 3, XP12006042, May 1, 2002, pp. 625-633.

A. LiBassi, et al., "Density, $sp^3$ content and internal layering of DLC films by X-ray reflectivity and electron energy loss spectroscopy", Diamond and Related Materials, vol. 9, 2000, pp. 771-776.

J. Angus, "Dense "Diamondlike" Hydrocarbons As Randon Covalent Networks", J. Vac. Sci, Technol. A., vol. 6, No. 3, May/Jun. 1988, pp. 1778-1782. XP-002520863.

* cited by examiner

Fig10-a
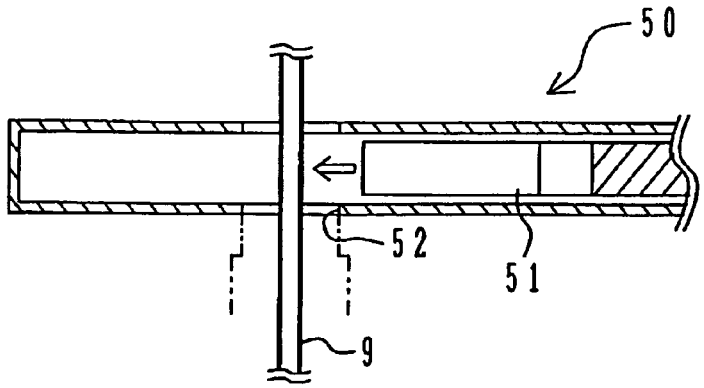
Fig10-b
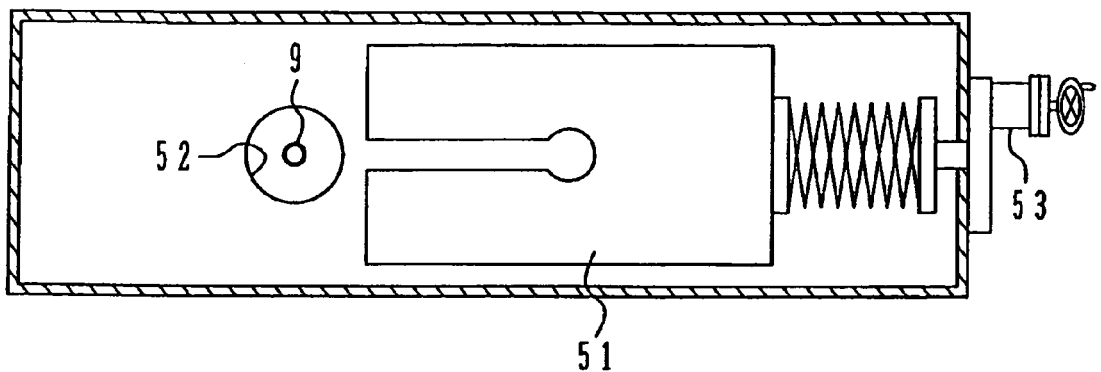
Fig10-c
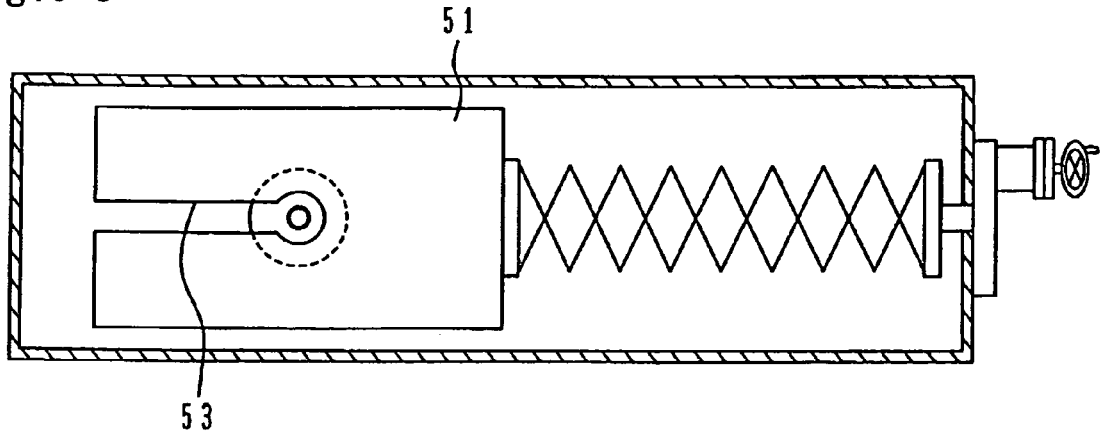

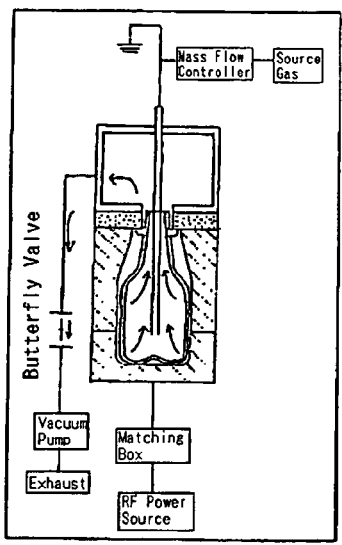
Fig. 23-a
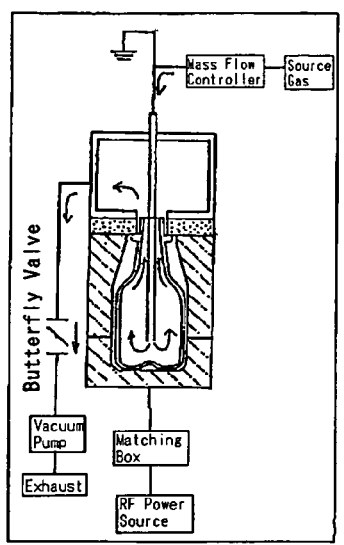
Fig. 23-b
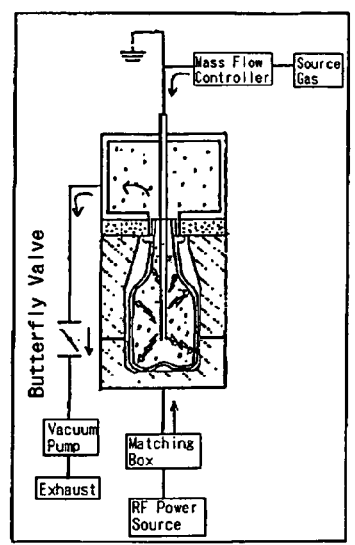
Fig. 23-c

DLC FILM COATED PLASTIC CONTAINER, AND DEVICE AND METHOD FOR MANUFACTURING THE PLASTIC CONTAINER

TECHNOLOGICAL FIELD

The present invention is related to a plastic container having an inner wall surface coated with a diamond like carbon (DLC) film, a manufacturing method thereof and a manufacturing apparatus therefor.

PRIOR ART TECHNOLOGY

Japanese Laid-Open Patent Application No. HEI 8-53117 discloses an apparatus for manufacturing a carbon film coated plastic container which coats the inner wall surface of the plastic container with a carbon film, and a manufacturing method thereof. As shown in FIG. 11, this apparatus is equipped with a hollow external electrode 112 which is formed to house a container and includes a space having a shape roughly similar to the external shape of the housed container 120, an insulating member 111 which insulates the external electrode and makes contact with a mouth portion of the container when the container is housed inside the space of the external electrode, a grounded internal electrode 116 which is inserted into the inside of the container housed inside the space of the external electrode from the mouth portion 120A of the container, exhaust means 115 which communicate with the inside of the space of the external electrode to exhaust the inside of the space, supply means 117 which supply a source gas to the inside of the container housed inside the space of the external electrode, and a high frequency power source (RF power source) 114 which is connected to the external electrode.

The manufacturing method of the same laid-open patent application forms a carbon film by a plasma CVD method which generates plasma between the external electrode and the internal electrode in the same apparatus. Namely, in the method of manufacturing a carbon film coated plastic container, a space having a shape roughly similar to the external shape of a housed container is formed in the external electrode, the external electrode is insulated by an insulating member which makes contact with the mouth portion of the container housed inside this space, an internal electrode is inserted into the inside of the container housed inside the space from the mouth portion of the container and this internal electrode is grounded, the inside of the space of the external electrode is exhausted, a source gas is supplied to the inside of the container housed inside the space of the external electrode, and then a high frequency is applied to the external electrode.

SUMMARY OF THE INVENTION

According to research conducted by the inventors of the present invention, a DLC film coated plastic container manufactured by electrodes similar to those disclosed in the laid-open patent application described above had a satisfactory oxygen barrier property (the oxygen permeability was reduced to less than one tenth compared to the base material) but the color of the neck portion was dark. Further, when the container was recycled, there were cases where the coloration of the neck portion caused problems such as coloration of the recycled items.

In the laid-open patent application described above, plasma is created after a prescribed film forming pressure is achieved by balancing the exhaust of the inside of the space housing the plastic container and the supply of source gas to the inside of the plastic container. Accordingly, when plasma is created and before and after this, the source gas normally flows through the inside of the plastic container, and this forms a source gas flux. In the case where a container having a container shape in which the neck portion is narrow relative to the body portion is made the object, the cross-sectional area of a horizontal cross section at the neck portion of the container with respect to a central axis of the vertical direction of the container becomes smaller suddenly compared to the body portion. Due to this kind of sudden decrease of cross-sectional area, the present inventors discovered that the gas pressure of the source gas flowing through the inside of the container rises at the neck portion which causes the plasma density to also rise. In this way, because the DLC film formed on the inner wall surface of the neck portion of the container exposed to high density plasma receives more plasma damage or a stronger plasma etching effect, there is considerably more coloring of dark yellowish brown at the neck portion than there is at the body portion.

In this regard, it is an object of the present invention to provided an apparatus for manufacturing a DLC film coated plastic container which has the same degree of oxygen barrier property as a prior art DLC film coated plastic bottle, and can prevent the coloring of the DLC film formed on the neck portion of the container. Namely, it is an object to mitigate plasma damage or plasma etching of the DLC film at the neck portion by adjusting the relationship between the space (neck portion offset distance) between the container outer wall at the neck portion of the container and the container side electrode inner wall and the space (body portion offset distance) between the container outer wall at the body portion of the container and the container side electrode inner wall under conditions in which a desired oxygen barrier property is obtained. Further, it is an object to prevent irregular color of the container and solve recycling problems due to the coloring described above by providing a manufacturing apparatus that makes it possible to form a transparent film roughly the same as that of the body portion on the neck portion. Further, by adjusting the neck portion offset distance and the body portion offset distance, it is possible to prevent the occurrence of irregular color in the rotation direction of the container central axis.

Further, it is an object of the present invention to regulate the neck portion offset distance in more detail in the manufacturing apparatus according to the present invention. Namely, an optimum neck portion offset is regulated with the plasma density distribution, the oxygen barrier property (oxygen permeability) or the coloration degree of the container as an indicator.

Further, it is an object of the present invention to provide a manufacturing apparatus which has a container side electrode having an inner wall structure suited to a container having an axial symmetrical shape with respect to the central axis of the vertical direction of the container. At this time, combined concrete and simple shapes of the inner wall structure of the container side electrode are proposed.

Further, it is an object of the present invention to propose combined concrete and simple shapes of the inner wall structure of an optimum container side electrode for containers having an angular tube-shaped body portion.

Further, it is an object of the present invention to concretely regulate the body portion offset distance for obtaining a container coloration degree (which changes depending on plasma density distribution shifts and the like) below a prescribed value, and a required oxygen barrier property in the manufacturing apparatus according to the present invention.

Further, as an object of both securing a required oxygen barrier property and preventing coloration, it is an object of the present invention to provide a plurality of manufacturing methods which prevent coloration of the container by controlling the increase of source gas pressure inside the container at the neck portion so as to form a uniform plasma density distribution. Further, it is an object of the present invention to also propose an optimum manufacturing apparatus when executing these manufacturing methods.

Further, it is an object of the present invention to provide a manufacturing apparatus which solves the problems described above and at the same time makes it possible to prevent the adherence of dust to a source gas inlet pipe.

Further, it is an object of the present invention to provide an optimum manufacturing method and an optimum manufacturing apparatus for manufacturing containers for beverages.

In this way, it is an object of the present invention to provide a recyclable plastic container which has an oxygen gas barrier property and can prevent coloration of the neck portion.

An apparatus for manufacturing a DLC film coated plastic container according to the present invention includes a container side electrode which forms one portion of a pressure-reducing chamber which houses a container formed from plastic in which the cross-sectional area of an opening of said container is made smaller than the cross-sectional area of a horizontal cross section at a body portion of said container and a neck portion is provided between said opening and said body portion, and a facing electrode which faces said container side electrode and is arranged inside said container or above said opening, wherein said container side electrode and said facing electrode are made to face each other via an insulating body which forms a portion of said pressure-reducing chamber, source gas supply means which supply a source gas that is converted to plasma for coating the inner wall surface of said container with a diamond like carbon (DLC) film includes a supply gas inlet pipe provided in said pressure-reducing chamber to introduce said source gas supplied to said pressure-reducing chamber to the inside of said container, exhaust means which exhaust gas inside said pressure-reducing chamber from above the opening of said container are provided, and high frequency supply means which supply a high frequency is connected to said container side electrode, wherein said container side electrode is formed so that the average inner hole diameter (R2) of the inner wall surrounding said neck portion when the container is housed becomes smaller than the average inner hole diameter (R1) of the inner wall surrounding said body portion, and the average distance (d2) between the outer wall of said container and the inner wall of said container side electrode in a horizontal cross section with respect to the vertical direction of said container at said neck portion becomes longer than the average distance (d1) between the outer wall of said container and the inner wall of said container side electrode in a horizontal cross section with respect to the vertical direction of said container at said body portion.

In the apparatus for manufacturing a DLC film coated plastic container described preferably said average distance d2 is formed to be a distance which suppresses the rise in plasma density accompanying the rise in pressure of the source gas converted to plasma at said neck portion inside said container in order to form a roughly uniform plasma density inside said container.

In the apparatus for manufacturing a DLC film coated plastic container described in claim 1, preferably said average distance d2 is formed to be the same as or shorter than the distance at which the strength of ionic impacts due to collisions of the ions of the source gas converted to plasma with the inner wall surface of said container forms an ionic impact strength capable of forming a DLC film having a prescribed lower limit oxygen barrier property, and said average distance d2 is formed to be the same as or longer than the distance at which the entire wall surface of said container has a roughly uniform color by suppressing coloration of a specific part of said container from said neck portion to said opening caused by plasma damage or plasma etching of the inner wall surface of said container due to the increase in plasma density accompanying the increase in pressure of the source gas converted to plasma in said neck portion inside said container.

In the apparatus for manufacturing a DLC film coated plastic container described, preferably said average distance d2 is formed to be a distance at which the DLC film coated plastic container secures a prescribed oxygen barrier property and the entire wall surface of said DLC film coated plastic container has a roughly uniform color.

In the apparatus for manufacturing a DLC film coated plastic container described, preferably the average diameter of said body portion of said container is made D1, the average diameter of said neck portion is made D2, and in the case where K is made an offset coefficient that satisfies the relationship of Equation 1, the offset coefficient K satisfies the relationship of Equation 2 or Equation 3, and said average distance d2 forms the d2 determined from Equation 1.

$$d2 = K \times (D1-D2)/2 + d1 \quad \text{(Equation 1)}$$

$$0.29 \leq K \leq 0.79 \text{ where } 0.2 \text{ mm} \leq d1 \leq 2.0 \text{ mm} \quad \text{(Equation 2)}$$

$$0.11 \leq K \leq 0.51 \text{ where } 2.0 \text{ mm} < d1 \leq 4.0 \text{ mm} \quad \text{(Equation 3)}$$

In the apparatus for manufacturing a DLC film coated plastic container described, preferably the average diameter of said body portion of said container is made D1, the average diameter of said neck portion is made D2, an offset coefficient that satisfies the relationship of Equation 4 is made K, and when α of Equation 4 is a container compensation coefficient that takes into account the container shape dependency satisfying Equation 5, the offset coefficient K satisfies the relationship of Equation 2 or Equation 3, and said average distance d2 forms the d2 determined from Equation 4.

$$d2 = \alpha K \times (D1-D2)/2 + d1 \quad \text{(Equation 4)}$$

$$\alpha = (D1/D2)^2/3.54 \quad \text{(Equation 5)}$$

In the apparatus for manufacturing a DLC film coated plastic container described preferably said container has an axial symmetrical shape with respect to the central axis of the vertical direction, and the inner wall shape of said container side electrode is formed to be an axial symmetrical shape with respect to said central axis when said container is housed.

In the apparatus for manufacturing a DLC film coated plastic container described, preferably when said container is housed in said container side electrode, the inner wall of said container side electrode surrounding said body portion of said container is formed to have a cylindrical shape, the inner wall of said container side electrode surrounding said neck portion of said container is formed to have a truncated cone shaped cylindrical shape in which the diameter becomes smaller toward the container opening, and the inner wall of said container side electrode is formed to have a continuous shape that does not have different stages.

In the apparatus for manufacturing a DLC film coated plastic container described, preferably the inner wall of said container side electrode surrounding the opening of said container is formed to have a cylindrical shape.

In the apparatus for manufacturing a DLC film coated plastic container described, preferably said body portion of said container has a square tube shape, the inner wall of said container side electrode surrounding said body portion of said container is formed to have a square tube shape, the inner wall of said container side electrode surrounding said neck portion of said container is formed to have a truncated pyramid shaped square tube shape in which the diameter becomes smaller toward the container opening, a square tube shape or a shape which is a combination of these, and the inner wall of said container side electrode is formed to have a continuous shape that does not have different stages.

In the apparatus for manufacturing a DLC film coated plastic container described preferably the inner wall of said container side electrode surrounding the opening of said container is formed to have a square tube shape.

In the apparatus for manufacturing a DLC film coated plastic container described preferably said container side electrode is formed so that d1 is greater than 0 mm and less than or equal to 4 mm.

Further an apparatus for manufacturing a DLC film coated plastic container according to the present invention includes a container side electrode which forms one portion of a pressure-reducing chamber which houses a container formed from plastic, and a facing electrode which faces said container side electrode and is arranged inside said container or above said opening, wherein said container side electrode and said facing electrode are made to face each other via an insulating body which forms a portion of said pressure-reducing chamber, source gas supply means which supply a source gas that is converted to plasma for coating the inner wall surface of said container with a DLC film includes a supply gas inlet pipe provided in said pressure-reducing chamber to introduce said source gas supplied to said pressure-reducing chamber to the inside of said container, exhaust means which exhaust gas inside said pressure-reducing chamber from above the opening of said container are provided, and high frequency supply means which supply a high frequency is connected to said container side electrode, wherein exhaust conductance adjustment means are provided to carry out adjustment by freely restricting the amount of gas exhaust that is exhausted from a horizontal cross section of said pressure-reducing chamber above the opening of said container.

In the apparatus for manufacturing a DLC film coated plastic container described preferably said container is a container for beverages.

Further a method of manufacturing a DLC film coated plastic container according to the present invention includes the steps of exhausting the inside of a container formed from plastic to a pressure less than or equal to a prescribed pressure, then introducing a source gas which will be converted to plasma to the inside of said container while continuing to exhaust the inside of said container so that the inside of said container is replaced with said source gas and a prescribed equilibrium pressure is formed inside said container, then stopping most of the exhaust of the inside of said container and making the introduction rate of said source gas smaller than the introduction rate at the time of replacement so that the flow of said source gas inside said container is slowed and the pressure distribution inside said container is made roughly uniform, and then generating source gas type plasma inside said container to form a DLC film on the inner wall surface of said plastic container.

Further, a method of manufacturing a DLC film coated plastic container according to the present invention includes the steps of exhausting the inside of a container formed from plastic to a pressure less than or equal to a prescribed pressure, then making the exhaust rate inside said container smaller or zero and introducing a source gas which will be converted to plasma to the inside of said container, and then generating source gas type plasma inside said container to form a DLC film on the inner wall surface of said plastic container at the point in time when the pressure distribution inside said container is roughly uniform and a prescribed pressure has been reached.

In the method of manufacturing a DLC film coated plastic container described preferably said container is a container for beverages.

A DLC film coated plastic container according to the present invention is a plastic container having a DLC film formed on the inner wall surface thereof in which the cross-sectional area of an opening of said container is made smaller than the cross-sectional area of a horizontal cross section at a body portion of said container and a neck portion is provided between said opening and said body portion, wherein the DLC film formed on said neck portion has a lower graphite mixing proportion than the DLC film formed on said body portion, and the oxygen permeability of said container is less than or equal to 0.0050 ml/container (500 ml PET container)/day (23° C. and RH 90%, measurement values after 20 hours from the start of nitrogen gas replacement). At this time, preferably the amount of graphite mixing of the DLC film formed on said neck portion is 5~18% of the amount of graphite mixing of said body portion. In this regard, the amount of mixing is compared for the same film thickness.

Further, the oxygen permeability of the container is given for a 500 ml container prescribed as a standard, but this can be applied to containers having other capacities by carrying out ratio conversion. For example, in a 1000 ml container, oxygen permeability is less than or equal to 0.0100 ml/container/day.

Further, a DLC film coated plastic container according to the present invention is a plastic container having a DLC film formed on the inner wall surface thereof in which the cross-sectional area of an opening of said container is made smaller than the cross-sectional area of a horizontal cross section at a body portion of said container and a neck portion is provided between said opening and said body portion, wherein the DLC film formed on said neck portion has a higher hydrogen atom content than the DLC film formed on said body portion, and the oxygen permeability of said container is less than or equal to 0.0050 ml/container (500 ml PET container)/day (23° C. and RH 90%, measurement values after 20 hours from the start of nitrogen gas replacement). At this time, preferably the composition proportion of carbon and hydrogen (carbon atom/hydrogen atom) of the DLC film formed on said neck portion is 37/63~48/52, and the composition proportion of carbon and hydrogen (carbon atom/hydrogen atom) of the DLC film formed on said body portion is 55/45~75/25.

Further, a DLC film coated plastic container according to the present invention is a plastic container having a DLC film formed on the inner wall surface thereof in which the cross-sectional area of an opening of said container is made smaller than the cross-sectional area of a horizontal cross section at a body portion of said container and a neck portion is provided between said opening and said body portion, wherein the DLC film formed on said neck portion has a lower graphite mixing proportion and a higher hydrogen atom content than the DLC film formed on said body portion, and the oxygen permeability of said container is less than or equal to 0.0050 ml/container (500 ml PET container)/day (23° C. and RH 90%, measurement values after 20 hours from the start of nitrogen gas replacement). At this time, preferably the amount of graphite mixing of the DLC film formed on said neck portion is 5~18% of the amount of graphite mixing of said body portion, the composition proportion of carbon and hydrogen (carbon atom/hydrogen atom) of the DLC film formed on said neck portion is 37/63~48/52, and the composition proportion of carbon and hydrogen (carbon atom/hydrogen atom) of the DLC film formed on said body portion is 55/45~75/25.

In the apparatus for manufacturing a DLC film coated plastic container of the present invention, it is possible to prevent coloration of the DLC film at the neck portion of a container manufactured to have the same level of oxygen barrier property as a prior art DLC film coated plastic bottle. This is achieved by adjusting the relationship between the neck portion offset length and the body portion offset length to mitigate plasma damage or plasma etching of the DLC film at the neck portion. In this way, irregular color of the container can be prevented by forming a transparent film roughly the same as that of the body portion on the neck portion, and this makes it possible to solve the recycling problem due to coloration.

Further, in the present invention, an optimum offset is determined by indicating the plasma density distribution, the oxygen barrier property (oxygen permeability) or the coloration level of the container.

Further, the present invention shows concrete and simple embodiments of a manufacturing apparatus suited to a container having an axial symmetrical shape with respect to the central axis of the vertical direction of the container or a container having a square tube shaped body portion. In this way, instead of preparing a separate container side electrode to match each of the various shapes of beverage containers, for example, the container side electrode can be used for all applications.

The present invention concretely shows the body portion offset length in the manufacturing apparatus according to the present invention, and in this way a container coloration level at or below a prescribed value and a required oxygen barrier property were obtained.

Further, in the manufacturing method of the present invention, coloration of the container is prevented by suppressing the rise in source gas pressure at the neck portion inside the container and carrying out control so that the plasma density distribution becomes uniform, whereby both a required oxygen barrier property is secured and coloration is prevented. Further, the present invention proposes an optimum manufacturing apparatus when this manufacturing method is carried out.

Further, the present invention is designed to solve the problems described above and at the same time prevent the adherence of dust to the source gas inlet pipe.

Further, because both an oxygen barrier property and transparency are obtained, the present invention is ideally suited to the manufacture of beverage containers which require transparency and recyclability.

Further, the DLC film of the container manufactured by the apparatus of the present invention is a fine DLC film having a small number of graphite like carbon $sp^2$ bonding structures and a high proportion of $sp^3$ bonding structures (diamond structures and the like). This DLC film makes it possible to achieve a light uniform color over the entire container while securing an oxygen barrier property.

BRIEF DESCRIPTION OF THE DRAWINGS

FIGS. 10(a)~10(c) are conceptual drawings which show details of the exhaust conductance adjustment means, wherein FIG. 10(a) is a schematic drawing showing one embodiment of the exhaust conductance adjustment means 50 in a cross section taken in the plane formed by the axial direction of the source gas inlet pipe 9 and the insertion direction of a restrictor 51 of the exhaust conductance adjustment means 50. FIG. 10(b) is a cross-sectional schematic drawing taken along X-X in FIG. 9, and is the case where the restrictor 51 is open. FIG. 10(c) is a cross-sectional schematic drawing taken along X-X in FIG. 9, and is the case where the restrictor 51 is closed.

FIG. 23 is a drawing which shows the sequence of Manufacturing Method 3.

The meaning of the symbols is as follows. 1 shows an upper electrode, 2 shows a lower electrode, 3 shows a container side electrode, 4 shows an insulating body, 5 shows a facing electrode, 5a shows a tubular body, 5b shows a tubular body end, 5c shows an internal electrode, 6 shows a pressure-reducing chamber, 7 shows a plastic container, 8 shows an O-ring, 9 shows a source gas inlet pipe, 9a shows a blowout hole, 10 shows an opening, 11 shows an annular portion of the facing electrode, 12 shows a matching box, 13 shows a high frequency power source, 14 shows high frequency supply means, 16 shows a pipeline, 17 shows a source gas generating source, 18 shows source gas supply means, 19 shows a vacuum valve, 20 shows an exhaust pump, 21 shows exhaust means, 23 shows an exhaust port, 50 shows exhaust conductance adjustment means, 51 shows a restrictor, 52 shows a through hole, and 53 shows a restrictor opening/closing mechanism.

PREFERRED EMBODIMENTS OF THE INVENTION

Detailed descriptions showing embodiments of the present invention are given below, but it should not be interpreted that the present invention is limited to these descriptions.

Figure 1:
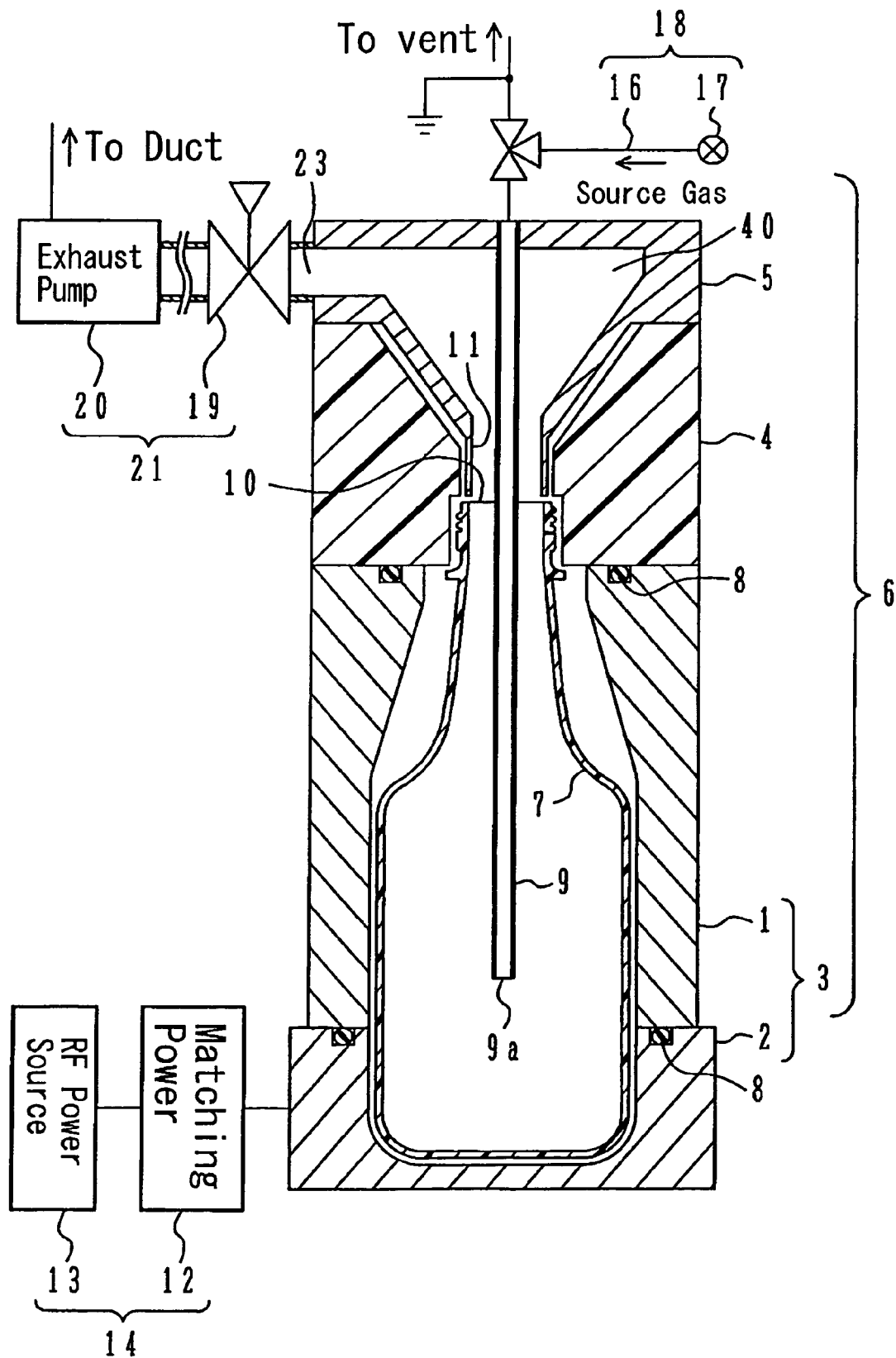
FIG. 1 is a schematic drawing which shows one embodiment of the present manufacturing apparatus.

First, the structure of an apparatus for manufacturing a DLC film coated plastic container according to the present invention will be described with reference to FIGS. 1~12. Further, the same symbols are used for the same members in the drawings. FIG. 1 is a schematic drawing showing one embodiment of the present manufacturing apparatus. FIGS. 1, 3~7, 9 and 12 are cross-sectional schematic drawings of a pressure-reducing chamber taken along the vertical direction of a container. As shown in FIG. 1, the manufacturing apparatus has a container side electrode 3 which forms one portion of a pressure-reducing chamber 6 which houses a container 7 formed from plastic in which the cross-sectional area of an opening 10 of the container 7 is made smaller than the cross-sectional area of a horizontal cross section at a body portion of the container 7 and provided with a neck portion between the opening 10 and the body portion, and a facing electrode 5 which faces the container side electrode 3 and is arranged inside the container 7 or above the opening 10, wherein the container side electrode 3 and the facing electrode 5 are made to face each other via an insulating body 4 which forms a portion of the pressure-reducing chamber 6, source gas supply means 18 which supply a source gas that is converted to plasma for coating the inner wall surface of the container 7 with a DLC film includes a supply gas inlet pipe 9 provided in the pressure-reducing chamber 6 to introduce the source gas supplied to the pressure-reducing chamber 6 to the inside of the container 7, exhaust means 21 which exhaust gas inside the pressure-reducing chamber 6 from above the opening 10 of the container 7 are provided, and high frequency supply means 14 which supply a high frequency is connected to the container side electrode 3.

The container side electrode 3 is constructed from an upper electrode 1 and a lower electrode 2 which can be attached to and removed from the upper electrode 1. An O-ring 8 is arranged between the upper electrode 1 and the lower electrode 2 to ensure airtightness. The upper electrode 1 and the lower electrode 2 form a conducting state so as to form one body as a container side electrode. The container side electrode 3 has a structure that is divided into the upper electrode 1 and the lower electrode 2 to provide a housing opening for housing the plastic container 7 inside the container side electrode 3. In FIG. 1, the container side electrode 3 is divided to form the two upper and lower portions, but it may be divided to form three upper, middle and lower portions for housing the container, or it may be divided vertically.

The container side electrode 3 shown in FIG. 1 is given a shape which houses the container 7 excluding the mouth portion of the container 7. The reason for this is that it reduces the formation of a DLC film on the inner wall surface of the mouth portion. Accordingly, in the case where a DLC film is formed on the inner wall surface of the mouth portion, a shape may be formed to house the entire container. Further, in order to adjust the film forming region, a shape may be formed to house the container excluding the mouth portion of the container and one portion of the neck portion.

Figure 2:
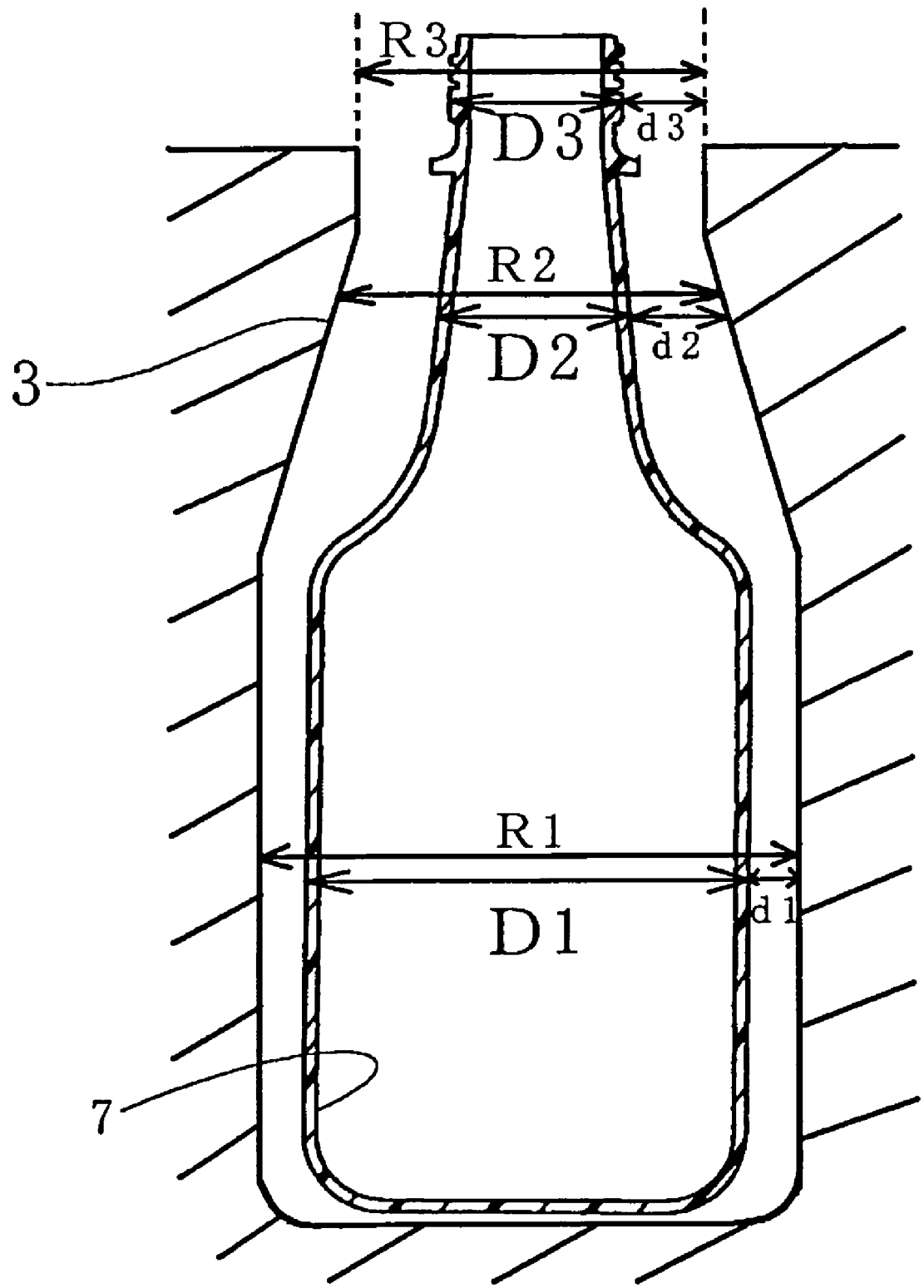
FIG. 2 is a drawing which shows the meaning of the symbols in the present invention.

Further, as shown in FIG. 2, the container side electrode 3 is formed so that the average inner hole diameter (R2) of the inner wall surrounding the container neck portion when the container is housed becomes smaller than the average inner hole diameter (R1) of the inner wall surrounding the body portion. At the same time, the container side electrode 3 is formed so that the average distance (d2; defined as the average neck portion offset length) between the container outer wall and the inner wall of the container side electrode in a horizontal cross section with respect to the vertical direction of the container at the neck portion becomes smaller than the average distance (d1; defined as the average body portion offset length) between the container outer wall and the inner wall of the container side electrode in a horizontal cross section with respect to the vertical direction of the container at the body portion. Further, d1 is preferably made sufficiently small so that the self bias produced at the container body portion wall surface at the time of plasma generation is not lowered more than necessary, and to avoid plasma concentration at the neck portion. Even though d1 will change depending on the container capacity and the film forming conditions, it is preferably greater than 0 mm and less than or equal to 4 mm. The relationship R2<R1 is established because in the relationship R2≧R1, the neck portion offset length is too long, and it is not possible to secure a required oxygen barrier property as described later. Further, when there is the relationship R2=R1, the inner wall of the container side electrode 3 forms a cylindrical shape. On the other hand, the relationship d2>d1 is established to suppress increase of the plasma density at the neck portion by providing a moderate neck portion offset, and to mitigate plasma damage or a plasma etching effect to the DLC film. Further, the relationship d2=d1 is the case where the outer wall of the container and the inner wall of the space of the container side electrode have similar shapes which almost touch.

When (R2<R1) and (d2>d1) are satisfied, the average neck portion offset length d2 preferably forms a distance that suppresses the increase of plasma density accompanying the increase in pressure of the source gas converted to plasma at the neck portion inside the container in order to form a roughly uniform plasma density inside the container. By making the plasma density uniform, degradation due to plasma damage or plasma etching of the DLC film formed on the neck portion is mitigated.

When (R2<R1) and (d2>d1) are satisfied, the average neck portion offset length d2 is formed to be the same as or shorter than the distance at which the strength of ionic impacts due to collisions of the ions of the source gas converted to plasma with the inner wall surface of the container forms an ionic impact strength capable of forming a DLC film having a prescribed lower limit oxygen barrier property. At the same time as this, the average neck portion offset length d2 is preferably formed to be the same as or shorter than the distance at which the entire wall surface of the container has a roughly uniform color by suppressing coloration of a specific part of the container from the neck portion to the opening caused by plasma damage or plasma etching of the inner wall surface of the container due to the increase in plasma density accompanying the increase in pressure of the source gas converted to plasma in the neck portion inside the container.

In the apparatus of the present invention, the formation of a DLC film on the inner wall surface of the container 7 is carried out by a plasma CVD method. Namely, discharging is produced by the high frequency applied between the container side electrode 3 and the facing electrode 5, plasma is generated, and if the conditions for continuing discharge are satisfied, the plasma discharge is stabilized. Then, the source gas is decomposed by the plasma to form various kinds of radicals (most of which are ionized to positive). On the other hand, the electrons produced by discharging accumulate on the inner wall surface, and a prescribed potential drop (the application of a self bias voltage) is created, whereby a potential well (called a sheath potential) is possible. Then, the energy of the kinds of radicals ionized at the inner wall surface of the container 7 are accelerated by the sheath potential created on the container wall surface, and these randomly collide with the entire inner surface of the inner wall surface. At this time, the undecomposed radicals and ions are finally decomposed on the inner wall surface of the container, and if the source gas is a hydrocarbon gas, there is bonding between adjacent carbon atoms and between carbon atoms and hydrogen atoms, and the release of temporarily bonded hydrogen atoms (a spattering effect) occurs. When the above processes are carried out, a very fine DLC film is formed on the inner wall surface of the container 7. By applying a moderate high frequency output and selecting a suitable gas flow rate, plasma discharge will continue between the container side electrode 3 and the facing electrode 5.

In this regard, if the strength of ionic impacts due to collisions of the ions of the source gas converted to plasma with the inner wall surface of the container is weak, a fine DLC film will not be obtained, and an oxygen barrier property will not be obtained. As the average neck portion offset length d2 becomes larger, the self bias voltage becomes smaller and the strength of the ionic impacts becomes weaker. Accordingly, the average neck portion offset length d2 must be an average neck portion offset length d2 that obtains an ionic impact strength greater than or equal to an ionic impact strength capable of forming a DLC film having a prescribed lower limit oxygen barrier property. Namely, the average neck portion offset length d2 needs to be formed to be the same as or shorter than the distance at which the strength of ionic impacts due to collisions of the ions of the source gas converted to plasma with the inner wall surface of the container forms an ionic impact strength capable of forming a DLC film having a prescribed lower limit oxygen barrier property. In this regard, the prescribed lower limit oxygen barrier property is an oxygen permeability of 0.0050 ml/container (500 ml PET container)/day (23° C. and RH 90%, measurement values after 20 hours from the start of nitrogen gas replacement).

When the average neck portion offset length d2 becomes shorter, the self bias voltage becomes higher. Then, with regard to the shoulder portion in comparison with the body portion, because an increase in plasma density occurs accompanying the increase in pressure of the source gas converted to plasma at the neck portion inside the container, there is more exposure to excessive plasma than there is at the body portion, whereby coloration at a specific part of the container from the neck portion to the opening is created by degradation (bonding state and the like) due to plasma damage or plasma etching. In order to make the entire wall surface of the container have a roughly uniform color, the average neck portion offset length d2 needs to be made sufficiently long so that this coloration does not occur.

To summarize the above, the average neck portion offset length d2 is preferably formed to be a distance at which the DLC film coated plastic container secures a prescribed oxygen barrier property and the entire wall surface of the DLC film coated plastic container has a roughly uniform color. Further, the prescribed oxygen barrier property is an oxygen permeability which is less than or equal to 0.0050 ml/container (500 ml PET container)/day (23° C. and RH 90%, measurement values after 20 hours from the start of nitrogen gas replacement).

Further, the average neck portion offset length d2 is calculated from Equation 1. As indicated by the symbols in FIG. 2, the average diameter of the body portion of the container is made D1, the average diameter of the neck portion is made D2, and in the case where K is made the offset coefficient that satisfies the relationship of Equation 1, the offset coefficient K satisfies the relationship of Equation 2 or Equation 3.

$$d2 = K \times (D1 - D2)/2 + d1 \quad \text{(Equation 1)}$$

$$0.29 \leq K \leq 0.79 \text{ where } 0.2 \text{ mm} \leq d1 \leq 2.0 \text{ mm} \quad \text{(Equation 2)}$$

$$0.11 \leq K \leq 0.51 \text{ where } 2.0 \text{ mm} < d1 \leq 4.0 \text{ mm} \quad \text{(Equation 3)}$$

In this regard, the average diameter of the body portion is the diameter of a cylinder in the case where the container body portion is approximated by a cylindrical shape having the same height and the same volume. The average diameter of the neck portion is the diameter of a cylinder in the case where the container neck portion is approximated by a cylindrical shape having the same height and the same volume.

In this regard, the offset coefficient K is a parameter used at the time the average neck portion offset length d2 is determined using D1, D2 and d1, and when K=0, this forms d2=d1, and the inner wall of the space housing the container of the container side electrode 3 forms a similar shape that almost touches the container. On the other hand, when K=1, this forms d2=(D1−D2)/2+d 1, and the inner wall of the space housing the container of the container side electrode 3 forms a cylindrical shape. The average neck portion offset length d2 at the time of forming a distance at which the DLC film coated plastic container secures a prescribed oxygen barrier property and the entire wall surface of the DLC film coated plastic container has a roughly uniform color is determined by the offset coefficient K given by Equation 2 or Equation 3.

Further, in order to compensate the container shape dependency of Equation 1, the average neck portion offset length d2 may be determined from Equation 4 by introducing the container compensation coefficient α shown in Equation 5. At this time, the offset coefficient K satisfies the relationship of Equation 2 or Equation 3.

$$d2 = \alpha K \times (D1 - D2)/2 + d1 \quad \text{(Equation 4)}$$

$$\alpha = (D1/D2)^2/3.54 \quad \text{(Equation 5)}$$

In the case where the container has an axial symmetrical shape with respect to the central axis of the vertical direction, the inner wall shape of the container side electrode 3 is preferably formed to be an axial symmetrical shape with respect to the container central axis when the container is housed. In this case, because a horizontal cross section of the container with respect to the central axis forms a circular shape, the inner wall of the container side electrode 3 also forms a circular shape concentric with this. In this way, the offset length on a horizontal cross section of the container with respect to the central axis becomes the same everywhere. Accordingly, it is possible for the distribution of the self bias voltage created on the container wall surface to be made uniform on a horizontal cross section of the container with respect to the central axis.

In the case where the container has an axial symmetrical shape with respect to the central axis of the vertical direction, when the container is housed in the container side electrode, the inner wall of the container side electrode surrounding the body portion of the container may be formed to have a cylindrical shape, the inner wall of the container side electrode surrounding the neck portion of the container may be formed to have a truncated cone shaped cylindrical shape in which the diameter becomes smaller toward the container opening, and the inner wall of the container side electrode may be formed to have a continuous shape that does not have different stages. The present inventors call the container side electrode having this shape a "cone compound electrode", and instead of preparing a separate container side electrode to match each of the various shapes of beverage containers, for example, this structure provides a container side electrode that can be used for all applications. This corresponds to the fact that the mouth portion of the container has a cylindrical shape.

In the cone compound electrode, the shape of the inner wall of the space can be constructed from two members comprising a cylindrical base portion and a cylindrical upper portion having a truncated cone shape. By forming a truncated cone shape, the body portion offset length and the neck portion offset length can be controlled independently by a relatively simple structure. Further, an optimum electrode structure can be searched easily for various containers having different shapes.

In the cone compound electrode, the inner wall of the container side electrode surrounding the opening of the container may be formed to have a cylindrical shape.

On the other hand, in the case of so-called square bottles where the body portion of the container has a square tube shape, the inner wall of the container side electrode surrounding the body portion of the container may be formed to have a square tube shape, the inner wall of the container side electrode surrounding the neck portion of the container may be formed to have a truncated pyramid shaped square tube shape in which the diameter becomes smaller toward the container opening, a square tube shape or a shape which is a combination of these, and the inner wall of the container side electrode (hereafter referred to as a "pyramid compound electrode") may be formed to have a continuous shape that does not have different stages. A DLC film coating can be obtained even when a film is formed on a square tube shaped container using the cone compound electrode described above, but the pyramid compound electrode is preferably applied in order to apply a uniform self bias voltage to the wall surface of the square bottle.

In the pyramid compound electrode, the shape of the inner wall of the space can be constructed from two members comprising a square tube base portion and a square tube upper portion having a truncated pyramid shape, and the body portion offset length and the neck portion offset length can be controlled independently by a relatively simple structure. Further, an optimum electrode structure can be searched easily for various containers having different shapes.

In the pyramid compound electrode, the inner wall of the container side electrode surrounding the opening of the container may be formed to have a square tube shape. This corresponds to the fact that the mouth portion of the container has a cylindrical shape. Further, the inner wall of the container side electrode surrounding the opening of the container may be formed to have a cylindrical shape, but in this case, stages will be created in the inner wall of the space of the container side electrode housing the container.

In the case where a pyramid compound electrode is used, in particular in the case of a 90° rotation object container, by substituting the length of one side in a horizontal cross section with respect to the container central axis at the body portion for D1 of Equation 4 and Equation 5, and by substituting the average length of one side in a horizontal cross section with respect to the container central axis at the neck portion for D2 of Equation 4 and Equation 5, K satisfies Equation 2 and Equation 3, and based on that, d2 can be calculated from Equation 4.

Next, a description will be given for the facing electrode 5. The facing electrode 5 is an electrode that faces the container side electrode 3. Accordingly, because the facing electrode 5 and the container side electrode 3 need to form an insulating state, the insulating body 4 is provided between these electrodes. The facing electrode 5 is arranged so as to be positioned above the opening 10 of the container. At this time, the entire facing electrode 5 or a portion thereof is preferably arranged near the opening 10 of the container. This shortens the distance to the container side electrode 3, and makes the plasma distribution become a uniform distribution inside the container. Further, the shape of the facing electrode 5 can be freely formed, but as shown in FIG. 1, the facing electrode is preferably equipped with an annular portion 11 having roughly the same inner hole diameter as the opening diameter of the plastic container 7. This facing electrode is formed so that the opening of the end of the annular portion 11 is aligned on the same axis for the opening 10 of the plastic container 7 and arranged near the opening 10 of the plastic container 7. The reason for forming an annular shape is because this makes it possible to prevent an increase of the exhaust resistance caused by the facing electrode. Further, the facing electrode 5 is preferably grounded.

Figure 3:
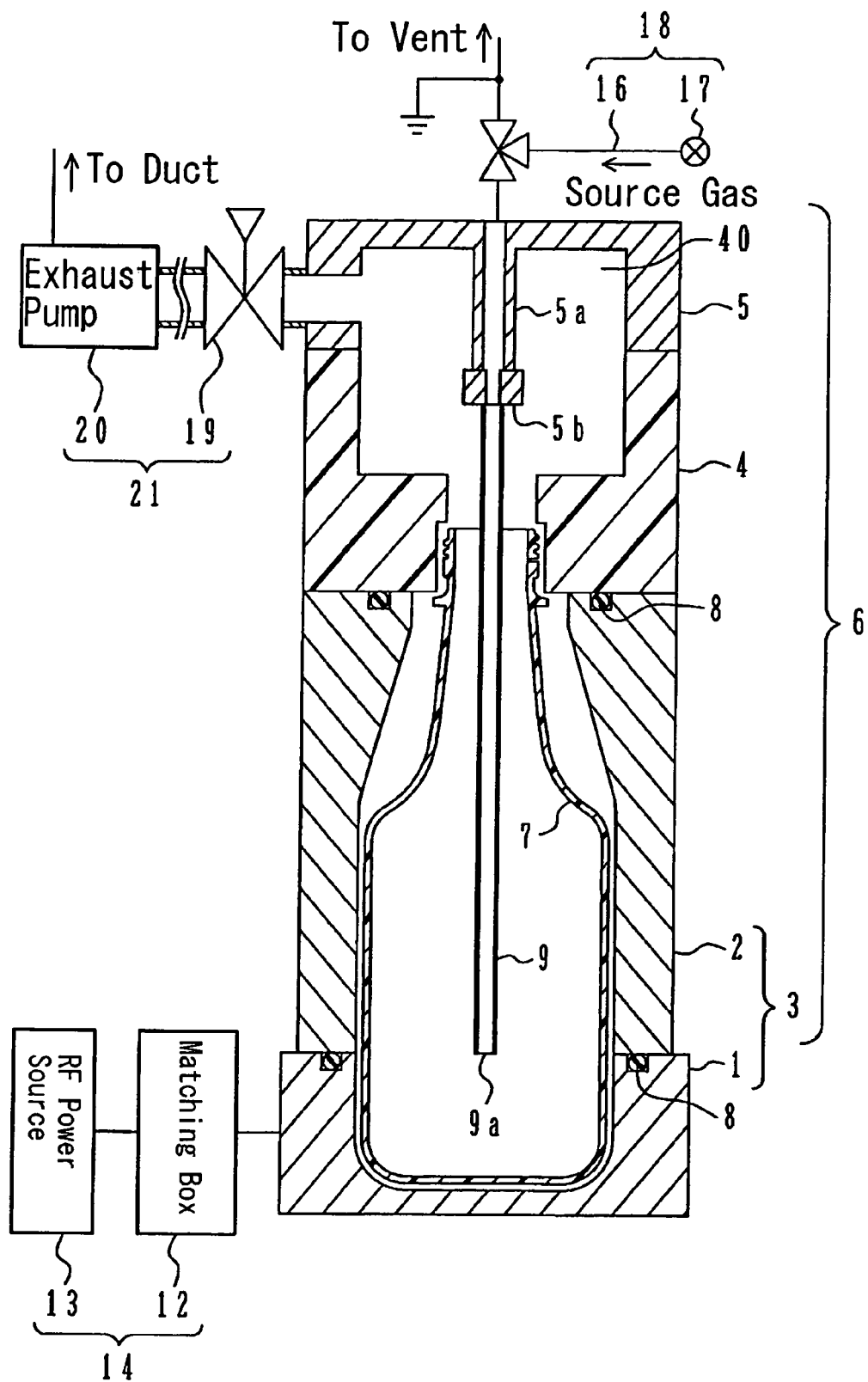
FIG. 3 is a schematic drawing which shows a second embodiment of the present manufacturing apparatus.

In the present invention, as shown in FIG. 3, the facing electrode 5 is formed to have a tubular portion 5a which hangs down from the top portion of the pressure-reducing chamber to a position above the opening 10 of the plastic container 7, the source gas supplied by the source gas supply means 18 is introduced to the inside of the tubular portion 5a, and the end 5b of the tubular portion 5a may be connected to the source gas inlet pipe 9. At this time, the end 5b of the tubular portion 5a is preferably arranged near the opening 10 of the plastic container 7. In the case of FIG. 3, the end 5b forms splicing means for connecting the tubular portion and the source gas inlet pipe. By forming this kind of structure, it is possible to eliminate the lowering of exhaust conductance as the facing electrode is brought near the opening 10. Accordingly, the plasma discharge is easily stabilized.

The facing electrode or the end of the annular portion 11 of FIG. 1 or the end of the tubular portion of FIG. 3 preferably makes contact with the gas flow formed from a position near the opening 10 of the plastic container 7 to an exhaust port 23 of the pressure-reducing chamber 6 by the exhaust means 21. This makes it possible to easily generate plasma and stabilize the discharge.

Further, by providing the facing electrode with the annular portion 11 of FIG. 1 or the tubular portion of FIG. 3, it is possible to reduce the unevenness of plasma distribution inside the plastic container in the circumferential direction of the container side, and this makes it possible to reduce the unevenness of the film distribution.

In the manufacturing apparatus of the present invention, in addition to the apparatus shown in FIG. 1 or FIG. 3, a facing electrode 5c may be formed to have a shape that is arranged inside the plastic container 7, namely, the facing electrode 5c may be formed as an internal electrode having an electrode shape that is inserted inside the container. At this time, the source gas inlet pipe is also used as the facing electrode 5c which is a conducting body.

Further, the material of the container side electrode and the facing electrode is preferably stainless steel (SUS) or aluminum.

The insulating body 4 serves the role of forming an insulating state between the facing electrode 5 and the container side electrode 3, and also serves the role of forming one portion of the pressure-reducing chamber 6. The insulating body is formed by a fluororesin, for example. The pressure-reducing chamber 6 is formed by assembling the container side electrode 3, the insulating body 4 and the facing electrode 5 to be mutually airtight. Namely, an O-ring is arranged between the container side electrode 3 and the insulating body 4 to ensure airtightness. Further, an O-ring (not shown in the drawings) is also arranged between the insulating body 4 and the facing electrode 5 to ensure airtightness. In the apparatus of FIG. 1, a structure is formed in which the facing electrode 5 is provided above the insulating body 4, but when the facing electrode 5 forms a facing electrode that faces the container side electrode 3, because the size thereof can be freely set, the size of the member formed from the insulating body 4 and the facing electrode 5 shown in FIG. 1 may be fixed, and the insulating body may be formed large with the facing electrode being made smaller by just that size portion. Alternatively, the insulating body may be formed small enough to serve the role of only a rough insulator with the facing electrode being made larger by just that size portion. A space 40 is formed inside the member formed from the insulating body 4 and the facing electrode 5, and the space 40 together with the space inside the plastic container 7 form a pressure-reducing space. The pressure-reducing chamber 6 forms this pressure-reducing space.

The source gas inlet pipe 9 is formed to have a hollow (cylindrical) shape. The material in the case where the apparatus is constructed so that the facing electrode is arranged outside the container as in FIG. 1 or FIG. 3 is preferably formed from a resin material having an insulating property and heat resistance sufficient to endure plasma. In this regard, fluororesin, polyamide, polyimide, and polyether ether ketone can be used as examples of a resin material. Alternatively, the source gas inlet pipe 9 is preferably formed from a ceramic material having an insulating property. Alumina, zirconia, titania, silica and quartz glass can be used as examples of a ceramic material. Further, in the case where the apparatus is constructed so that the facing electrode 5c is inserted inside the container as in FIG. 4, the source gas inlet pipe 9 is formed by stainless steel or aluminum. The source gas inlet pipe 9 is provided inside the pressure-reducing chamber 6 so as to be arranged inside the plastic container 7 by being freely inserted and removed through the opening 10 of the container. At this time, the source gas inlet pipe 9 is supported on the pressure-reducing chamber 6. As for the method of support, the source gas inlet pipe 9 can be supported on the facing electrode 5 as shown in FIG. 1, for example, or the source gas inlet pipe 9 can be supported on the tubular portion 5a via the splicing means as shown in FIG. 3. Further, one blowout hole (9a) which communicates the inside and the outside of the source gas inlet pipe 9 is formed on the lower end of the source gas inlet pipe 9. Further, instead of providing a blowout hole at the lower end, a plurality of blowout holes (not shown in the drawings) may be formed to pass through the inside and the outside of the source gas inlet pipe 9 in radial directions. The source gas inlet pipe 9 is connected to the end of a pipeline of the source gas supply means 18 which communicates with the inside of the source gas inlet pipe 9. Further, the apparatus is constructed so that the source gas sent into the inside of the source gas inlet pipe 9 via the pipeline can be blown into the inside of the plastic container 7 via the blowout hole 9a. Further, by forming the source gas inlet pipe 9 by an insulating material, it is possible to reduce the adherence of source gas type dust to the external surface of the source gas inlet pipe 9.

Figure 4:
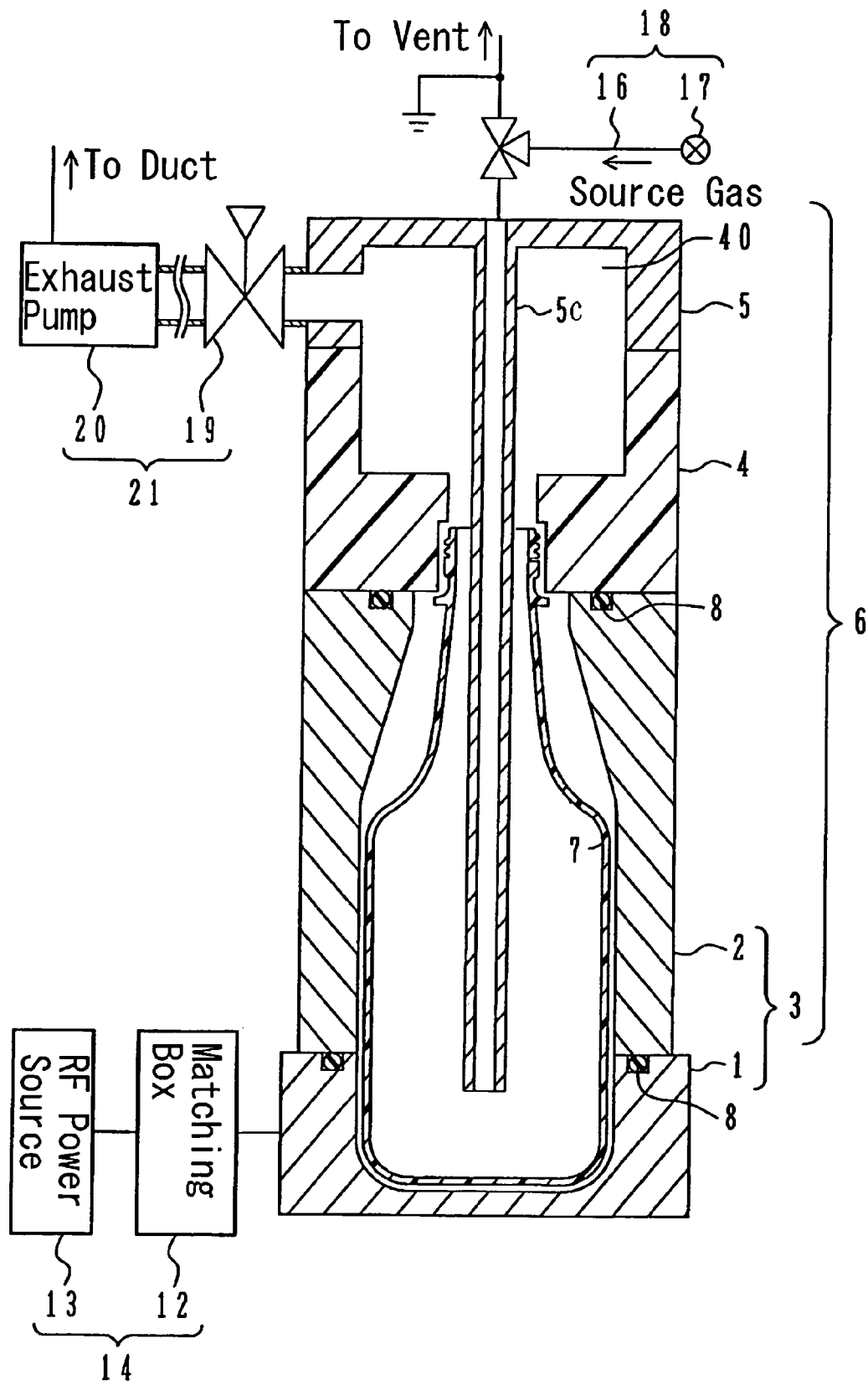
FIG. 4 is a schematic drawing which shows a third embodiment of the present manufacturing apparatus.
Figure 5:
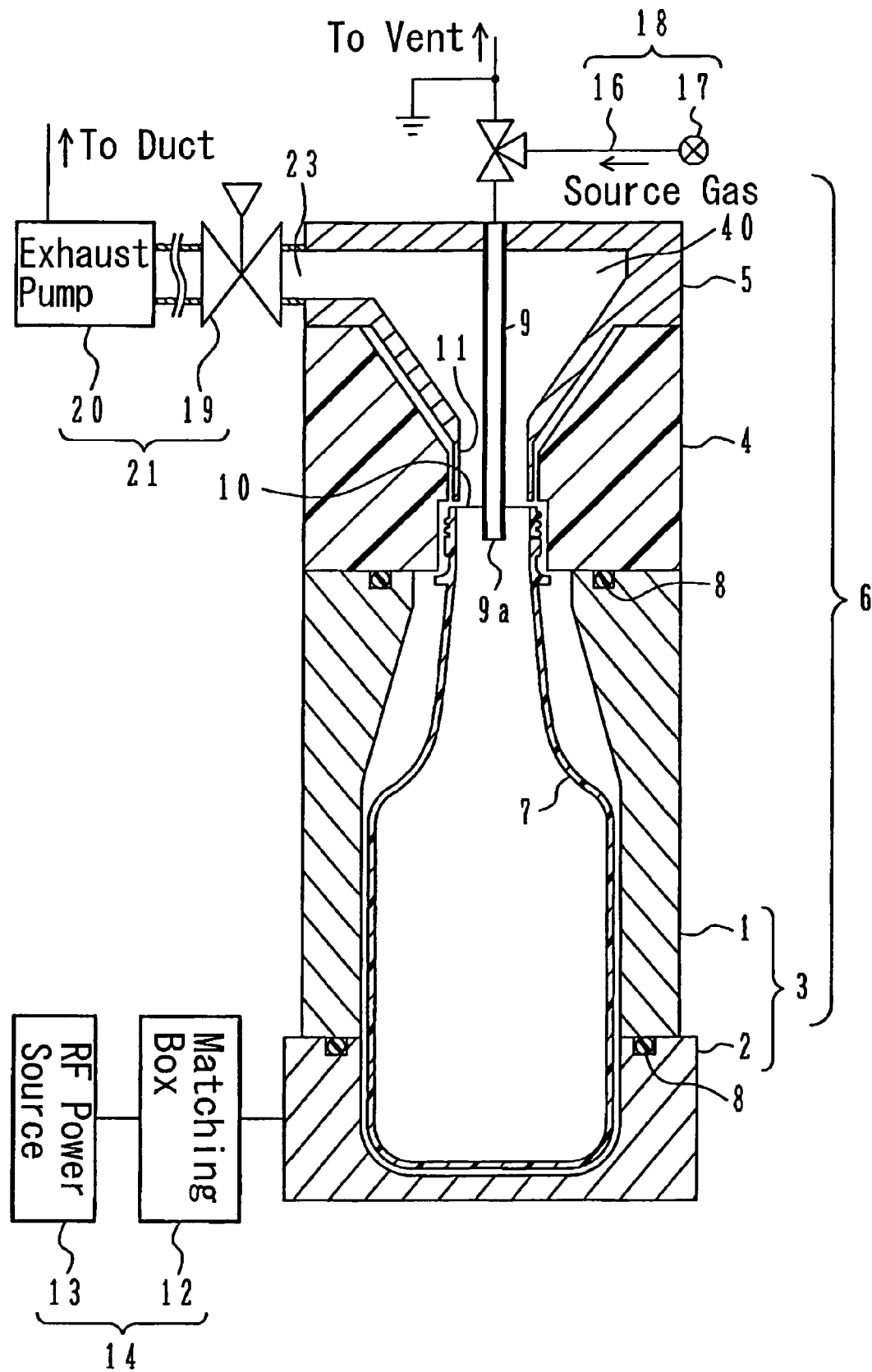
FIG. 5 is a schematic drawing which shows another embodiment of a source gas inlet pipe in the apparatus of FIG. 1.
Figure 6:
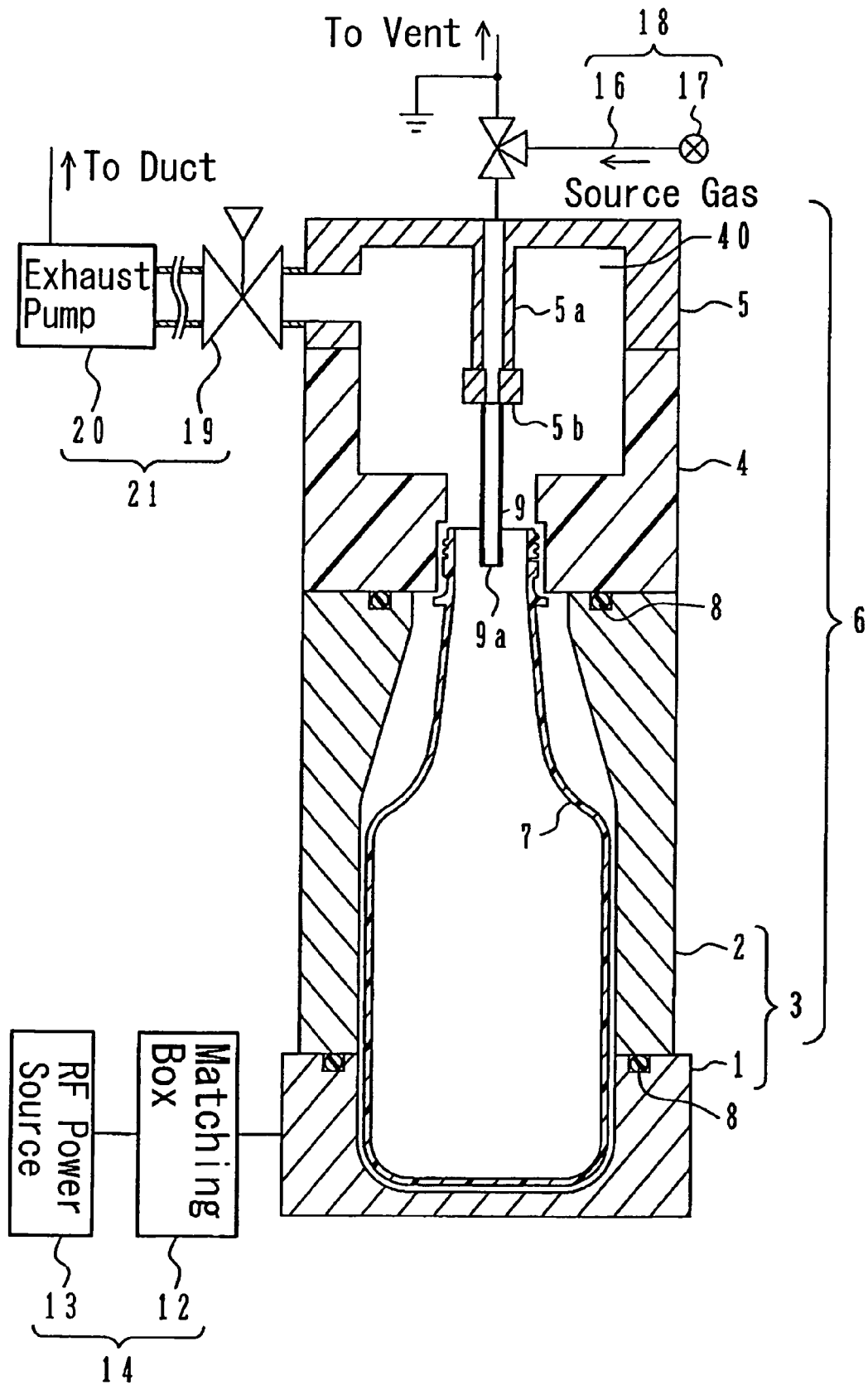
FIG. 6 is a schematic drawing which shows another embodiment of a source gas inlet pipe in the apparatus of FIG. 3.
Figure 7:
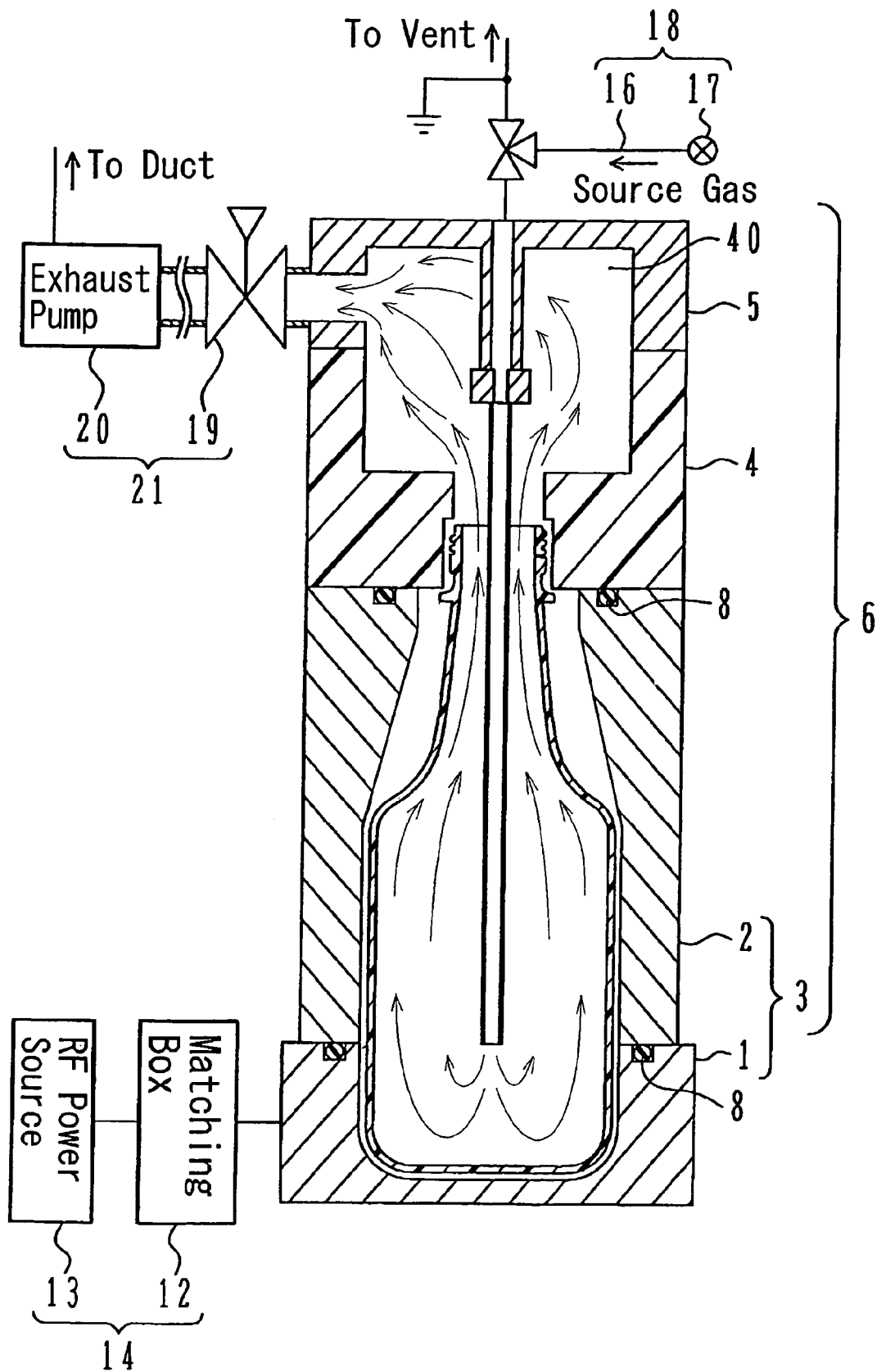
FIG. 7 is a conceptual drawing which shows the flow of gas from the container opening to the exhaust port using the apparatus of FIG. 3 as an example.

By inserting the tip portion of the source gas inlet pipe 9 through the opening of the plastic container to a position near the mouth portion as shown in FIG. 5 or FIG. 6, it becomes possible to supply source gas to the entire inside of the plastic container. In this regard, the tip of the source gas inlet pipe shown in FIG. 1, FIG. 3 or FIG. 4 is more preferably arranged to be freely inserted to and removed from a deep position reaching the bottom portion from the body portion through the opening of the plastic container. The reason for this is that it makes it possible to form a turbulence-free source gas flow from the bottom portion of the container to the opening as shown in FIG. 7, and this makes it possible to form a DLC film more uniformly on the inner wall surface of the container.

Further, in the apparatus of the present invention, the source gas inlet pipe is inserted inside the plastic container at the time a source gas is introduced, and source gas inlet pipe insertion/removal means (not shown in the drawings) may be provided to place the source gas inlet pipe in a removed state from the plastic container at the time plasma is generated. The source gas inlet pipe insertion/removal means make it possible to distribute source gas and form a DLC film over the entire inside of the plastic container, and there is absolutely no adherence of dust because the source gas inlet pipe make it possible to remove the source gas inlet pipe from the plasma region at the time a film is formed. Further, in the case where source gas inlet pipe insertion/removal means are provided to place the source gas inlet pipe in a removed state from the plastic container when plasma is generated, a valve (shutter) (not shown in the drawings) which can be freely opened and closed for the purpose of controlling the exhaust rate of the source gas is preferably provided near the opening 10.

Further, dust incineration means (not shown in the drawings) may be provided to incinerate dust adhering to a ceramic material type source gas inlet pipe 9 in the present apparatus. Two or more source gas inlet pipes which can be arranged in an alternating manner are prepared, and after a film is formed a prescribed number of times, the arrangement of the source gas inlet pipes are switched, and the dust adhering to the source gas inlet pipe in standby is incinerated by operating the dust incineration means.

The source gas supply means 18 introduces the source gas supplied from a source gas generating source 17 to the inside of the plastic container 7. Namely, one side of a pipeline 16 is connected to the facing electrode 5 or the insulating body 4, and the other side of the pipeline 16 is connected to one side of a mass flow controller (not shown in the drawings) via a vacuum valve (not shown in the drawings). The other side of the mass flow controller is connected to the source gas generating source 17 via a pipeline. The source gas generating source 17 generates a hydrocarbon gas or the like such as acetylene or the like.

Aliphatic hydrocarbons, aromatic hydrocarbons, oxygen-containing hydrocarbons, nitrogen-containing hydrocarbons and the like which form a gas or liquid at room temperature are used as a source gas. In particular, benzene, toluene, o-xylene, m-xylene, p-xylene, cyclohexane and the like having a carbon number of 6 or higher are preferred. Ethylene type hydrocarbons and acetylene type hydrocarbons represent examples of aliphatic hydrocarbons. These materials may be used separately or as a gas mixture or two or more types. Further, these gases may be used in a way in which they are diluted by a noble gas such as argon or helium. Further, in the case where a silicon-containing DLC film is formed, a Si-containing hydrocarbon type gas is used.

The DLC film in the present invention refers to an amorphous carbon film containing $sp^3$ bonding which is a carbon film that is also called an i-carbon film or a hydrogenated amorphous carbon film (a-CH). The amount of hydrogen contained in the DLC film which sets the film quality from hardness to softness (polymer like) is in the range from 0 atom % to 70 atom %.

The exhaust means 21 is constructed from a vacuum valve 19 and an exhaust pump 20 as well as a pipeline that connects these. The space 40 formed inside the member formed from the insulating body 4 and the facing electrode 5 is connected to one side of an exhaust pipeline. For example, in FIG. 1, an exhaust pipeline is connected to the exhaust port 23 provided in the facing electrode 5. The other side of the exhaust pipeline is connected to the exhaust pump 20 via the vacuum valve 19. The exhaust pump 20 is connected to an exhaust duct (not shown in the drawings). By operating the exhaust means 21, pressure is reduced in a pressure-reducing space formed from the space 40 and the space inside the container inside the pressure-reducing chamber 6.

The high frequency supply means 14 is formed from a matching box 12 which is connected to the container side electrode 3, and a high frequency power source 13 which supplies a high frequency to the matching box 12. The matching box 12 is connected to the output side of the high frequency power source 13. In FIG. 1, the high frequency supply means 14 is connected to the lower electrode 2, but it may also be connected to the upper electrode 1. Further, the high frequency power source 13 is grounded. The high frequency power source 13 generates a high frequency voltage between itself and the ground potential, and in this way a high frequency voltage is applied between the container side electrode 3 and the facing electrode 5. In this way, the source gas inside the plastic container 7 is converted to plasma. The frequency of the high frequency power source is 100 khz~1,000 MHz, and the industrial frequency of 13.56 MHz is used, for example.

The container according to the present invention includes a container that uses a cover or a stopper or is sealed, or a container used in an open state that does not use these. The size of the opening is determined in accordance with the contents. The container shape is especially preferred to be a container shape having a neck portion in which the cross-sectional area of the opening of the container is made smaller than the cross-sectional area of a horizontal cross section at the body portion of the container. This is because in a container having this shape, the pressure increases at the neck portion when the source gas flows, and this also increases the plasma density, whereby the DLC film receives plasma damage or plasma etching. Further, the plastic container includes a plastic container having a moderate stiffness and a prescribed thickness, and a plastic container formed from a sheet material that does not have stiffness. The substance that is filled into the plastic container according to the present invention can be a beverage such as a carbonated beverage or a fruit juice beverage or a soft drink or the like, as well as a medicine, an agricultural chemical, or a dried food which hates moisture absorption. Further, the container may be either a returnable container or a one-way container.

Figure 8:
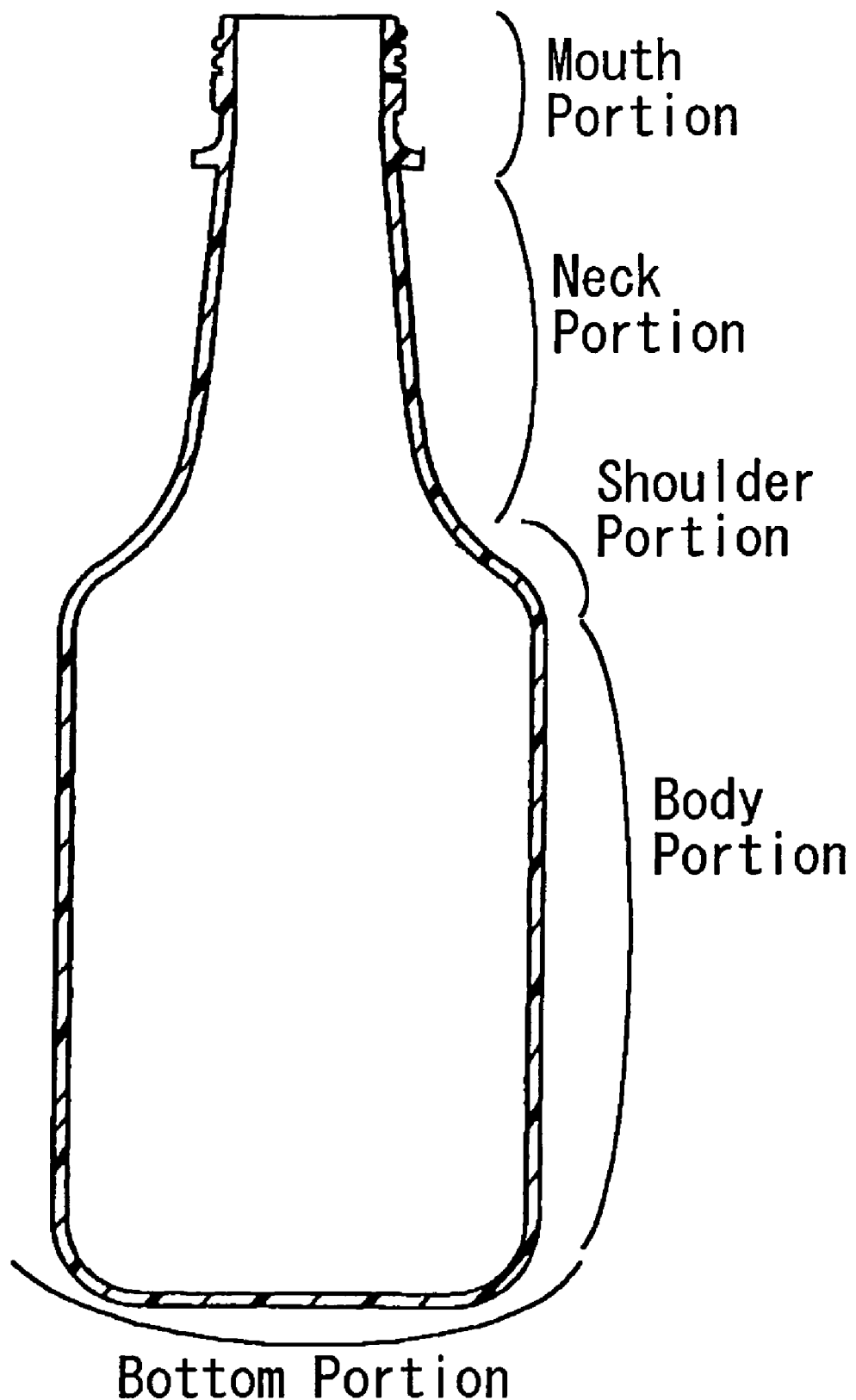
FIG. 8 is a drawing which shows the names of each part of a beverage container.

Further, in the present invention, each part of a beverage container or a container having a shape similar to this is named as shown in FIG. 8.

The resin used when forming the plastic container 7 of the present invention can be polyethylene terephthalate (PET) resin, polybutylene terephthalate resin, polyethylene naphthalate resin, polyethylene resin, polypropylene (PP) resin, cycloolefin copolymer (COC, annular olefin copolymer) resin, ionomer resin, poly-4-methylpentene-1 resin, polymethyl methacrylate resin, polystyrene resin, ethylene-vinyl alcohol copolymer resin, acrylonitrile resin, polyvinyl chloride resin, polyvinylidene chloride resin, polyamide resin, polyamide-imide resin, polyacetal resin, polycarbonate resin, polysulfone resin, or ethylene tetrafluoride, acrylonitrile-styrene resin, acrylonitrile-butadiene-styrene resin, for example. Of these, PET is particularly preferred.

Figure 9:
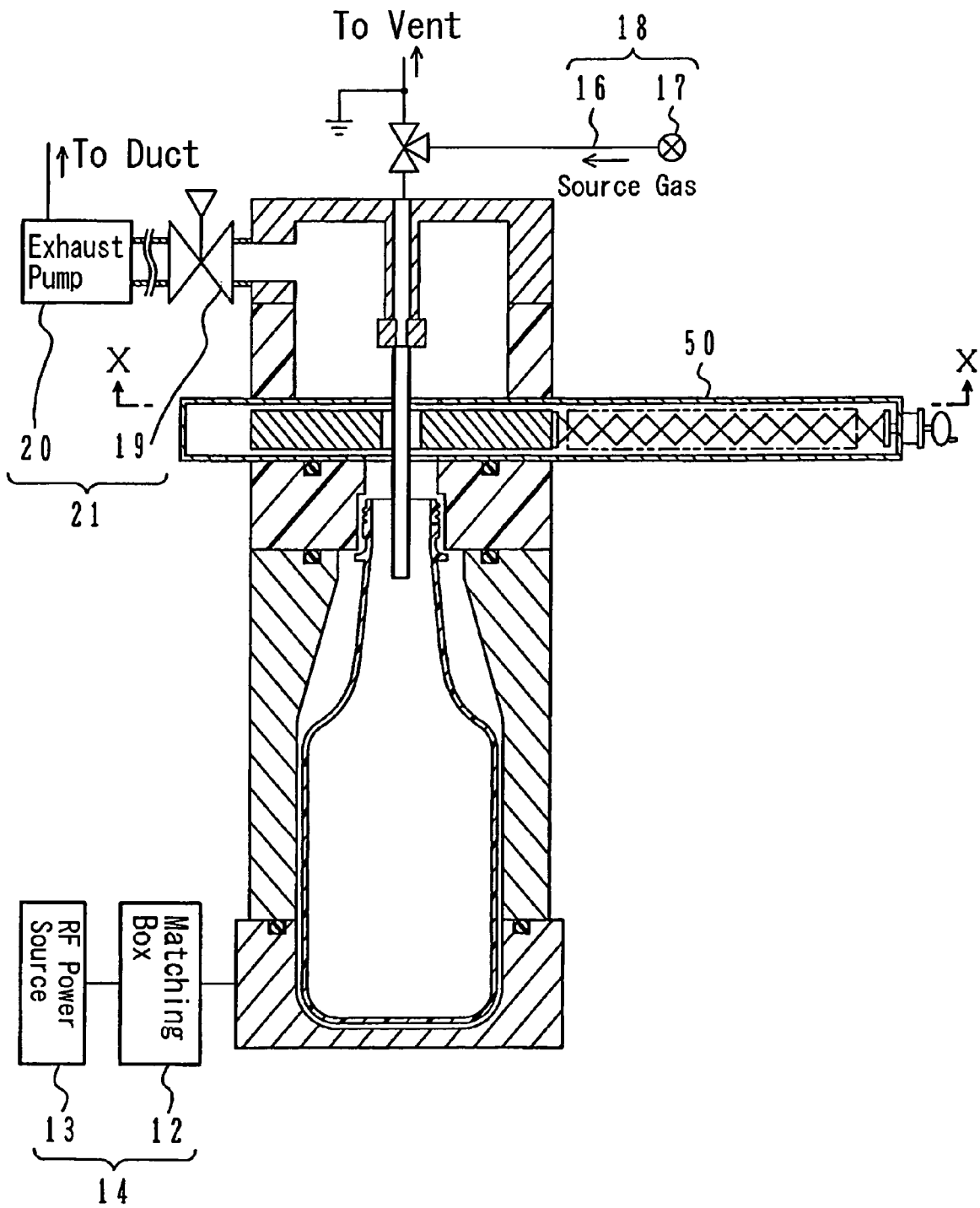
FIG. 9 is a schematic drawing of an apparatus in the case where exhaust conductance adjustment means are provided using the apparatus of FIG. 3 as an example.
Figure 11:
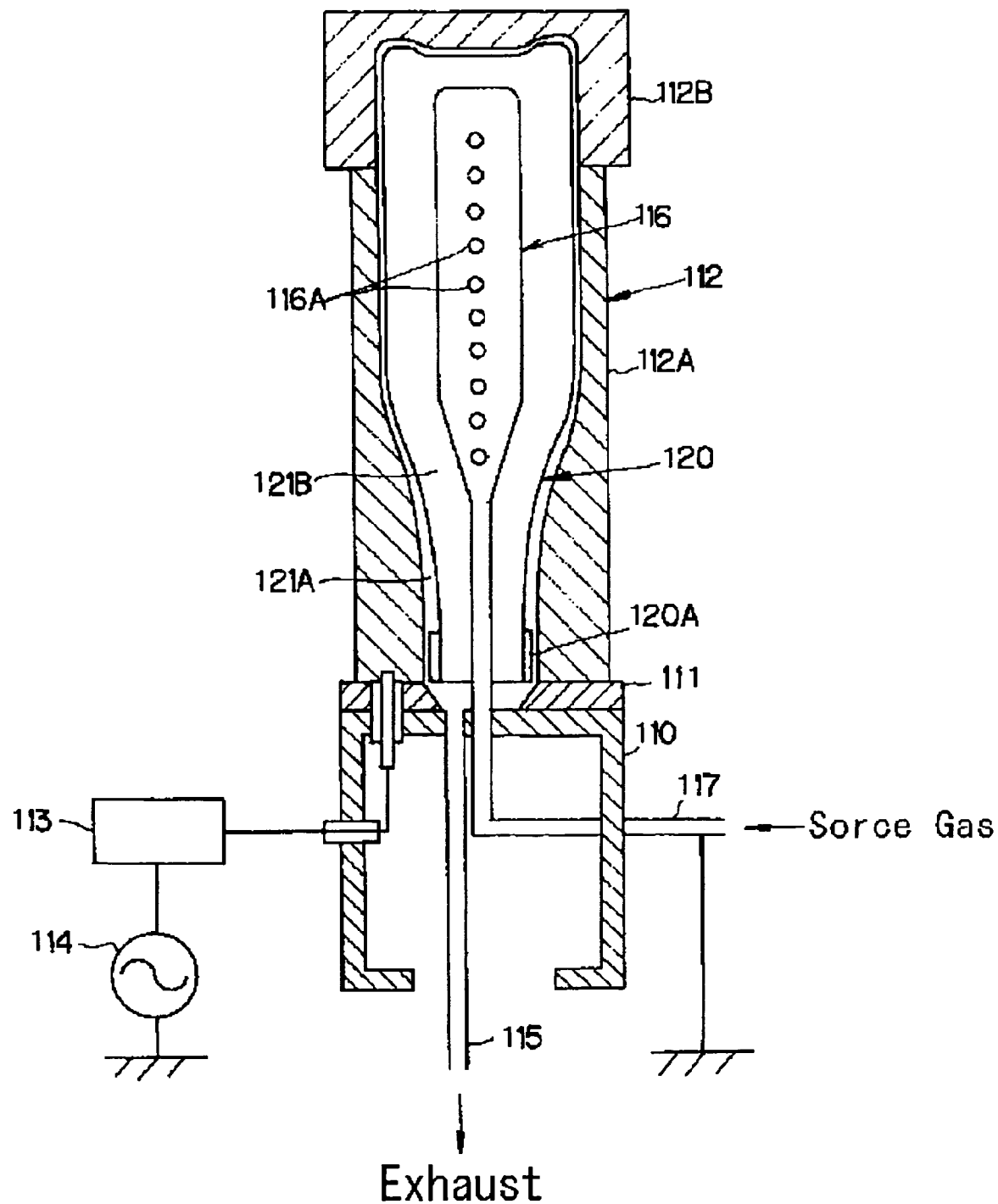
FIG. 11 is a drawing which shows a conceptual drawing of a prior art apparatus for manufacturing a DLC film coated plastic container.

In the present invention, in a manufacturing apparatus in which the facing electrode 11 or 5a is arranged above the container opening taking FIG. 1 or FIG. 3 as an example, or in a manufacturing apparatus in which a so-called internal electrode is arranged by arranging the facing electrode 5c inside the container taking FIG. 4 as an example, exhaust conductance adjustment means 50 are preferably provided to carry out adjustment by restricting the amount of gas exhaust that is exhausted from a horizontal cross section of the pressure-reducing chamber 6 above the opening 10 of the plastic container 7 as shown in FIG. 9, for example.

In order to describe the exhaust conductance adjustment means 50 in detail, a description will be given using FIG. 10. FIG. 10(a) is a schematic drawing showing one embodiment of the exhaust conductance adjustment means 50 in a cross section taken in the plane formed by the axial direction of the source gas inlet pipe 9 and the insertion direction of a restrictor 51 of the exhaust conductance adjustment means 50. FIG. 10(b) is a cross-sectional schematic drawing taken along X-X in FIG. 9, a n d is the case where the restrictor 51 is open. FIG. 10(c) is a cross-sectional schematic drawing taken along X-X in FIG. 9, and is the case where the restrictor 51 is closed. Further, the object shown by the symbol 52 in FIG. 10 is a horizontal cross section of the pressure-reducing space inside the pressure-reducing chamber above the container opening, and is a through hole of the pressure-reducing chamber that allows exhaust gas to flow. At this time, in order to adjust the flow of gas exhausted from the container, the exhaust conductance adjustment means 50 is provided above the container opening.

The exhaust conductance adjustment means 50 (a special gate valve) is formed from the restrictor 51 and a restrictor opening/closing mechanism 53 which opens and closes the restrictor 51. The restrictor 51 is instantly moved toward the source gas inlet pipe by the restrictor opening/closing mechanism 53 to cover the through hole 52 of the pressure-reducing chamber. FIG. 10(c) shows the case where the restrictor 51 is moved completely to the end. In this way, it becomes possible to adjust the amount of exhaust gas exhausted from the container. Further, in the exhaust conductance adjustment means 50 shown in FIG. 10, an insertion guide 53 for the source gas inlet pipe 9 is cut into the restrictor 51, and due to the existence of the insertion guide 53, the through hole 52 of the pressure-reducing chamber is not completely covered even when the restrictor 51 is restricted as in FIG. 10(c). Accordingly, the exhaust conductance adjustment means 50 shown in FIG. 10 does not completely shut off the flow of gas exhausted from the container.

Instead of the embodiment shown in FIG. 10, the exhaust conductance adjustment means 50 may be constructed to open and close the through hole 52 by moving two restrictors having the same shape as the restrictor 51 of FIG. 10 toward each other in a symmetrical arrangement with respect to the source gas inlet pipe. When this structure is formed, because the insertion guide described above is mutually covered by the two restrictors, it becomes possible to almost completely shut off the flow of gas exhausted from the container.

Further, the shut off degree of the flow of gas exhausted from the container may be adjusted by a restricting mechanism that is the same as a light quantity restricting mechanism of a camera in which the source gas inlet pipe forms a centripetal axis for the purpose of opening and closing the through hole 52 of the pressure-reducing chamber.

The above-mentioned three embodiments of the exhaust conductance adjustment means 50 were described, but other embodiments of a restrictor may be formed for the purpose of opening and closing the through hole 52 of the pressure-reducing chamber.

It becomes possible to adjust the flow of gas exhausted from the container over a wide range by operating the separate opening and closing of the exhaust conductance adjustment means 50, or operating the opening and closing of the vacuum valve 19, or operating the opening and closing of the exhaust conductance adjustment means 50 and the vacuum valve 19 by the exhaust conductance adjustment means 50 provided above the container opening.

In the present embodiment, an apparatus of the type in which the opening of the container faces upward is shown, but it is also possible to form a pressure-reducing chamber in which the top and bottom are reversed.

Further, in the present embodiment, a DLC film is the thin film formed by the manufacturing apparatus, but it is also possible to use the film forming apparatus described above when forming a Si-containing DLC film or other thin film.

Next, with reference to FIG. 1, a description will be given for a process in the case where a DLC film is formed on the inner wall surface of the plastic container 7 using the present apparatus.

(Manufacturing Method 1)

(Loading Container in Manufacturing Apparatus)

First, a vent (not shown in the drawings) is opened, and the inside of the pressure-reducing chamber 6 is opened to the atmosphere. In this way, air enters the space 40 and the space inside the plastic container 7, and the inside of the pressure-reducing chamber 6 reaches atmospheric pressure. Next, the lower electrode 2 of the container side electrode 3 is removed from the upper electrode 1, and the plastic container 7 is set so that the bottom portion thereof makes contact with the top surface of the lower electrode 2. A PET bottle is used as the plastic container 7, for example. Then, by raising the lower electrode 2, the plastic container 7 is housed in the pressure-reducing chamber 6. At this time, the source gas inlet pipe 9 provided in the pressure-reducing chamber 6 is passed through the opening 10 of the plastic container 7 and inserted inside the plastic container 7, and the facing electrode 5 is arranged above the opening of the container. Further, the container side electrode 3 is sealed by the O-ring 8.

(Operation to Reduce Pressure in Pressure-Reducing Chamber)

When the lower electrode 2 is raised to a prescribed position and the pressure-reducing chamber 6 is sealed, a state is formed in which the periphery of the plastic container 7 makes contact with the inner surface of the lower electrode 2 and the upper electrode 1. Next, after closing the vent, the exhaust means 21 is operated to exhaust the air inside the pressure-reducing chamber 6 through the exhaust port 23. Then, the pressure inside the pressure-reducing chamber 6 is reduced until a required vacuum level of 4 Pa, for example, is reached. This is because there will be too many impurities inside the container when the vacuum level is allowed to exceed 4 Pa.

(Introduction of Source Gas)

Then, the source gas (e.g., a carbon source gas such as an aliphatic hydrocarbon, an aromatic hydrocarbon or the like) sent from the source gas supply means 18 which controls the flow rate is introduced inside the plastic container 7 from the blowout hole 9a of the source gas inlet pipe 9. The source gas supply rate is preferably 20~50 ml/min. The concentration of the source gas becomes fixed, and a prescribed film forming pressure is stabilized at 7~22 Pa, for example, by balancing the controlled gas flow rate and the exhaust capacity.

(Plasma Film Formation)

By operating the high frequency power source 13, a high frequency voltage is applied between the facing electrode 5 and the container side electrode 3 via the matching unit 12, and source gas type plasma is generated inside the plastic container 7. At this time, the matching unit 12 matches the impedance of the container side electrode 3 and the facing electrode 5 by the inductance L and the capacitance C. In this way, a DLC film is formed on the inner wall surface of the plastic container 7. Further, the output (e.g., 13.56 MHz) of the high frequency power source 13 is approximately 200~500 W.

Namely, the formation of a DLC film on the inner wall surface of the plastic container 7 is carried out by a plasma CVD method. Namely, as described above, a self bias voltage is applied to the container wall surface, and the ions of the source gas converted to plasma are accelerated in accordance with the strength of the self bias voltage and spattered on the container inner wall surface, whereby a DLC film is formed. By carrying out a CVD process, a very fine DLC film is formed on the inner wall surface of the plastic container 7. By applying a moderate high frequency output, plasma discharge is continued between the container side electrode 3 and the facing electrode 5. The film formation time is several seconds which is short.

At this time, by providing a neck portion offset like that in the apparatus of FIG. 1 or FIG. 3, the self bias voltage of the neck portion is lowered moderately, and degradation of the film quality of the DLC film due to plasma damage or plasma etching caused by a concentration of plasma density at the neck portion is mitigated.

Further, after the concentration of source gas becomes fixed and stabilization at a prescribed film formation pressure is achieved by balancing the controlled gas flow rate and the exhaust capacity, the source gas inlet pipe may be removed from the plastic container before plasma generation by operating the source gas inlet pipe insertion/removal means, and then source gas type plasma may be generated inside the plastic container 7 by applying a high frequency voltage between the facing electrode 5 and the container side electrode 3 via the matching unit 12 by operating the high frequency power source 13. At this time, because the source gas inlet pipe is not inside the plastic container during plasma discharge, it is possible to almost completely suppress the adherence of dust.

(Termination of Film Formation)

The RF output from the high frequency power source 13 is stopped, and the supply of source gas is stopped. Then, the hydrocarbon gas inside the pressure-reducing chamber 6 is exhausted by the exhaust pump 20. Then, the vacuum valve 19 is closed, and the exhaust pump 20 is stopped. Then, the vent (not shown in the drawings) is opened to open the inside of the pressure-reducing chamber 6 to the atmosphere, and by repeating the above-described film formation method, a DLC film is formed on the inside of the next plastic container. The film thickness of the DLC film is formed to be 10~80 nm.

The plastic container manufactured in this way had an oxygen permeability the same as or lower than the carbon film coated plastic container mentioned in Japanese Laid-Open Patent Application No. HEI 8-53117. In the case where a 30 nm (average for the entire container) DLC film was formed on a plastic container having a capacity of 500 ml, a container height of 200 mm, a container body portion diameter of 71.5 mm, a mouth portion opening inner diameter of 21.74 mm, a mouth portion opening outer diameter of 24.94 mm, a container body portion thickness of 0.3 mm, and a resin weight of 32 g/container, the oxygen permeability was 0.0040 ml/container (500 ml PET container)/day (23° C. and RH 90%, measurement values after 20 hours from the start of nitrogen gas replacement).

In the present embodiment, a PET bottle for beverages was used as the container having a thin film formed on the inside, but it is also possible to use containers used for other uses.

(Manufacturing Method 2)

With reference to FIG. 9, a description will be given for a film formation method that roughly fixes the gas pressure inside the container and suppresses the rise of plasma density at the neck portion by adjusting the exhaust of source gas inside the plastic container at the time of film formation. The special feature of this manufacturing method is the structure in which the space of the container side electrode has a shape similar to the outer wall of the container, namely, it is a manufacturing method which can eliminate coloration of the container neck portion while having an oxygen barrier property even when coating is carried out using an apparatus in which the mouth portion offset length d3, the neck portion offset length d2 and the body portion offset length d1 are roughly the same.

The process of loading the container in the manufacturing apparatus is the same as the process described in Manufacturing Method 1 (loading a container in the manufacturing apparatus).

(Operation to Reduce Pressure in Pressure-Reducing Chamber)

The process of reducing the pressure in the pressure-reducing chamber is the same as the process described in Manufacturing Method 1 (operation to reduce pressure in the pressure-reducing chamber).

(Introduction of Source Gas)

Then, while continuing to exhaust the inside of the pressure-reducing chamber 6, namely, the inside of the plastic container, the source gas (e.g., a carbon source gas such as an aliphatic hydrocarbon, an aromatic hydrocarbon or the like) sent from the source gas supply means 18 which controls the flow rate is introduced inside the plastic container 7 from the blowout hole 9a of the source gas inlet pipe 9. At this time, the introduction rate of the source gas is 20~50 ml/min, for example. Then, the inside of the plastic container 7 is replaced by the source gas and the source gas concentration becomes fixed, and a prescribed film forming pressure is stabilized at 7~22 Pa, for example, by balancing the controlled gas flow rate through the inside of the plastic container 7 and the exhaust capacity.

Then, the exhaust of the inside of the plastic container 7 is almost completely stopped. The stopping of the exhaust is carried out by shutting the vacuum valve 19 of FIG. 9 or restricting the restrictor 51 of the exhaust conductance means 50 shown in FIG. 9 and FIG. 10 to the closed position. At the same time the exhaust is stopped, the introduction rate of the source gas is made smaller than the introduction rate at the time of replacement by the mass flow controller (not shown in the drawings) of the source gas supply means. At this time, the introduction rate of the source gas is 5~20 ml/min, for example. By carrying out this operation, the flow of source gas inside the plastic container 7 is slowed, and the pressure distribution inside the container is made roughly uniform.

(Plasma Film Formation)

After the source gas and the source gas pressure inside the plastic container form the state described above, a DLC film is formed on the inner wall surface of the plastic container 7 by carrying out the operations described in Manufacturing Method 1 (plasma film formation). Further, the output (e.g., 13.56 MHz) of the high frequency power source 13 is approximately 200~500 W.

The film thickness of the DLC film is formed to be 10~80 nm.

As described above, after the flow of source gas inside the plastic container 7 is slowed and at the same time the pressure distribution inside the container is made roughly uniform, the flow of source gas inside the container is made smaller by the generation of plasma. In this way, there is almost no constriction of source gas accompanying the sudden decrease of cross-sectional area of a horizontal cross section of the container vertical axis at the container shoulder portion, the pressure distribution inside the container is uniform, and there is no increase of plasma density at specific parts. In this way, it is possible to prevent the DLC film at specific parts from receiving plasma damage or plasma etching. The DLC film coated plastic container does not have coloration at the shoulder portion, and is almost transparent with a uniform color.

(Termination of Film Formation)

A process for terminating the film formation is carried out by carrying out the operations described in Manufacturing Method 1 (termination of film formation).

A plastic container having a capacity of 500 ml, a container height of 200 mm, a container body portion diameter of 71.5 mm, a mouth portion opening inner diameter of 21.74 mm, a mouth portion opening outer diameter of 24.94 mm, a container body portion thickness of 0.3 mm, and a resin weight of 32 g/container was used as the plastic container. The film thickness of the DLC film in this case was 25 nm (average for the entire container).

(Manufacturing Method 3)

With reference to FIG. 9, a description will be given for another embodiment of a film formation method that roughly fixes the gas pressure inside the container and suppresses the rise of plasma density at the neck portion by adjusting the exhaust of source gas inside the plastic container 7 at the time of film formation. The special feature of this manufacturing method is that it is a manufacturing method which can eliminate coloration of the container neck portion while having an oxygen barrier property even when coating is carried out using an apparatus in which the space of the container side electrode has a shape similar to the outer wall of the container.

The process of loading the container in the manufacturing apparatus is the same as the process described in Manufacturing Method 1 (loading a container in the manufacturing apparatus).

(Operation to Reduce Pressure in Pressure-Reducing Chamber)

The process of reducing the pressure in the pressure-reducing chamber is the same as the process described in Manufacturing Method 1 (operation to reduce pressure in the pressure-reducing chamber).

(Introduction of Source Gas)

Then, the exhaust rate inside the plastic container 7 is made smaller or made zero. The adjustment of exhaust is an adjustment of the vacuum valve 19 of FIG. 9 or an adjustment carried out by restricting the restrictor 51 of the exhaust conductance means 50 shown in FIG. 9 and FIG. 10 to the closed position. Together with this operation, the source gas (e.g., a carbon source gas such as an aliphatic hydrocarbon, an aromatic hydrocarbon or the like) sent from the source gas supply means 18 which controls the flow rate is introduced inside the plastic container 7 from the blowout hole 9a of the source gas inlet pipe 9. At this time, the introduction rate of the source gas is 5~40 ml/min, for example.

(Plasma Film Formation)

Then, at the point in time when the pressure distribution inside the plastic container 7 is roughly uniform and a prescribed pressure is reached, a DLC film is formed on the inner wall surface of the plastic container 7 by carrying out the operations described in Manufacturing Method 1 (plasma film formation). Further, the output (e.g., 13.56 MHz) of the high frequency power source 13 is approximately 200~500 W, and the prescribed pressure inside the container is approximately 10~50 Pa.

The film thickness of the DLC film is formed to be 10~80 nm.

In this way, by adjusting the exhaust, after the flow of source gas inside the plastic container 7 is slowed and at the same time the pressure distribution inside the container is made roughly uniform, it is possible to obtain results that are the same as those of Manufacturing Method 2, namely, it is possible to prevent rises in plasma density at specific parts by the generation of plasma. The DLC film coated plastic container does not have coloration at the shoulder portion, and is almost transparent with a uniform color.

(Termination of Film Formation)

A process for terminating the film formation is carried out by carrying out the operations described in Manufacturing Method 1 (termination of film formation).

A plastic container having a capacity of 500 ml, a container height of 200 mm, a container body portion diameter of 71.5 mm, a mouth portion opening inner diameter of 21.74 mm, a mouth portion opening outer diameter of 24.94 mm, a container body portion thickness of 0.3 mm, and a resin weight of 32 g/container was used as the plastic container. The film thickness of the DLC film in this case was 25 nm (average for the entire container).

In Manufacturing Method 2 or Manufacturing Method 3, the manufacturing apparatus of FIG. 9 in which the facing electrode is provided outside the container was described as an example, but a manufacturing apparatus in which the internal electrode 5c is arranged inside the container as a facing electrode like the manufacturing apparatus of FIG. 4 may be used, or a manufacturing apparatus in which exhaust conductance means (the same as the exhaust conductance means 50 of FIG. 9) are provided in the apparatus of FIG. 4 may be used.

Figure 24:
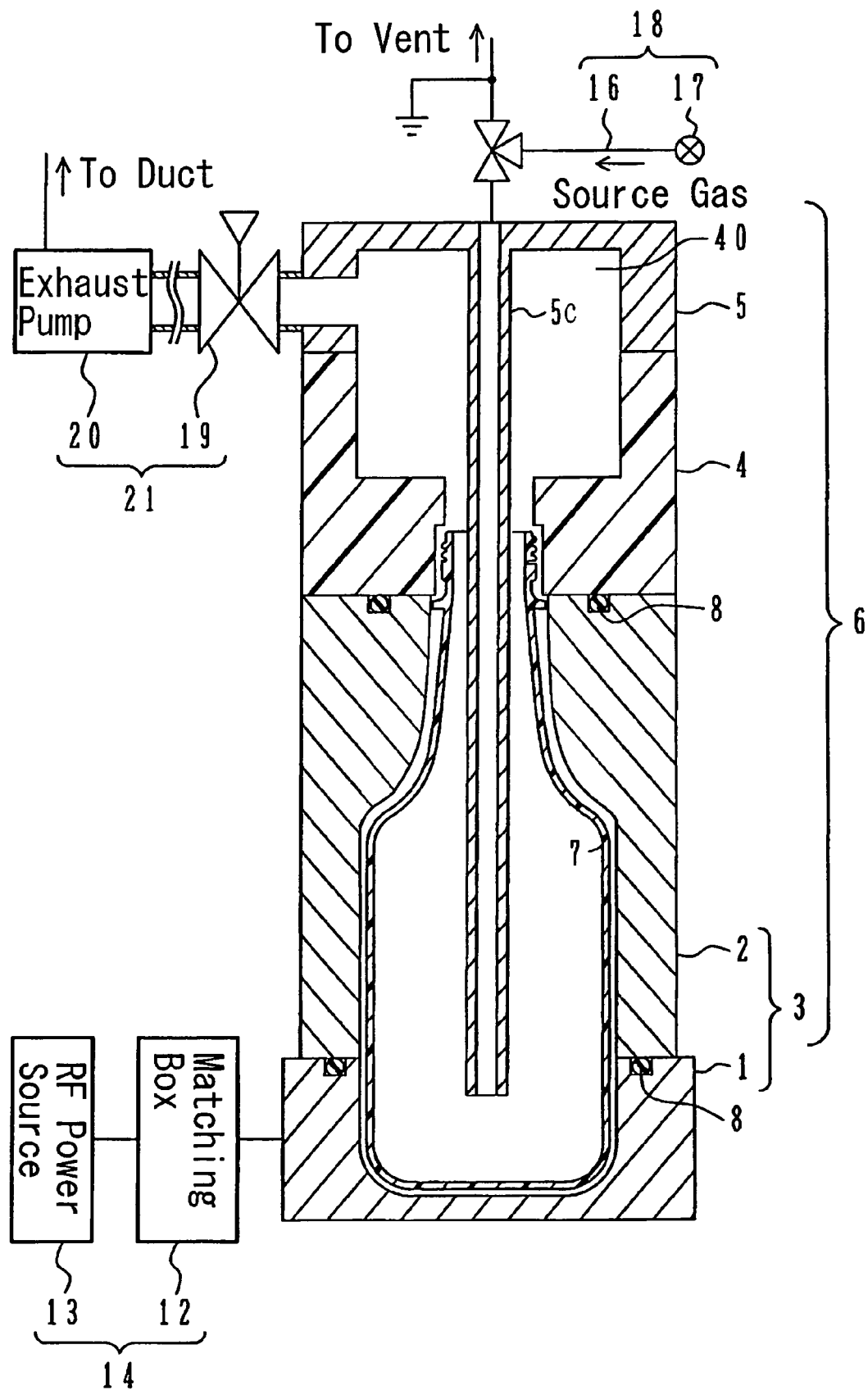
FIG. 24 is a schematic drawing of the case where the container side electrode is given an electrode structure having a shape similar to the container in the apparatus of FIG. 4.

In Manufacturing Method 2 or Manufacturing Method 3, a manufacturing apparatus in which the container side electrode is a similar shaped electrode like that shown in FIG. 24 may be used. A manufacturing apparatus in which exhaust conductance means (the same as the exhaust conductance means 50 of FIG. 9) are provided in the apparatus of FIG. 24 may be used.

Further, in Manufacturing Method 2 or Manufacturing Method 3, the processes up to the point before plasma generation are carried out while the source gas inlet pipe is in an inserted state in the plastic container, and then after the source gas inlet pipe is removed from the plastic container by operating the source gas inlet pipe insertion/removal means directly before plasma generation, source gas type plasma may be generated inside the plastic container 7 by applying a high frequency voltage between the facing electrode 5 and the container side electrode 3 via the matching unit 12 by operating the high frequency power source 13. At this time, because the source gas inlet pipe is not inside the plastic container during plasma discharge, it is possible to almost completely suppress the adherence of dust.

(Specific Embodiments)

(Examination of Optimum Offset Length)

A PET bottle having an axial symmetrical shape with respect to the central axis of the vertical direction of the container was used as the plastic container. The plastic container used in the present embodiments is a PET container having a capacity of 500 ml, a container height of 200 mm, a container body portion diameter of 71.5 mm, a mouth portion opening inner diameter of 21.74 mm and outer diameter of 24.94 mm, a container body portion thickness of 0.3 mm, and a resin weight of 32 g/container of polyethylene terephthalate resin (PET resin RT553 manufactured by Nihon Yunipet (Inc.)).

The apparatus used in the present embodiments is the apparatus shown in FIG. 3 or FIG. 4. FIG. 3 shows a manufacturing apparatus in the case where a tube made of fluororesin is used as the source gas inlet pipe in an apparatus in which a mouth side electrode 5a is arranged outside the container. FIG. 4 shows a manufacturing apparatus in the case where SUS is used for the internal electrode 5c which also functions as a gas inlet pipe. A plurality of cone compound electrode type container side electrodes is prepared for examination by changing the standards of the offset lengths. The offset lengths of the electrodes are shown in Table 1 and Table 2. Further, because the electrode is a cone compound electrode, the average opening offset length d3, the average neck portion offset length d2 and the average body portion offset length d1 are listed respectively as the opening offset length d3, the neck portion offset length d2 and the body portion offset length d1. Because a container manufactured using the apparatus of either FIG. 3 or FIG. 4 will obtain roughly the same results under the same conditions, the coatings of specific embodiments 1~16 were carried out by establishing the conditions of Table 1 and Table 2 in the apparatus of FIG. 3. The coatings were carried out in accordance with Manufacturing Method 1.

A DLC film was coated by an apparatus (not shown in the drawings) provided with a cylindrical electrode as Comparative Example 1, and by an apparatus provided with a similar shaped electrode in which the container outer wall and the inner wall of the space of the container side electrode are almost touching as Comparative Example 2. The coatings were carried out in accordance with Manufacturing Method 1. The conditions of the apparatus are shown in FIG. 3.

TABLE 1

Cone Compound Electrode Type

| Offset Length | Specific Embodiment 1 type 1 | Specific Embodiment 2 type 2 | Specific Embodiment 3 type 3 | Specific Embodiment 4 type 4 | Specific Embodiment 5 type 5 | Specific Embodiment 6 type 6 | Specific Embodiment 7 type 7 | Specific Embodiment 8 type 8 |
|---|---|---|---|---|---|---|---|---|
| Opening offset length (d3)mm | 2.0 | 5.0 | 8.0 | 12.0 | 8.0 | 2.0 | 2.0 | 2.0 |
| Neck portion offset length (d2)mm | 6.2 | 8.5 | 10.5 | 13.4 | 10.0 | 6.4 | 6.2 | 6.2 |
| Body portion offset length (d1)mm | 3.75 | 3.75 | 3.75 | 3.75 | 0.75 | 0.75 | 0.75 | 3.75 |
| Material | Al | Al | Al | Al | Al | Al | Al | Al |

TABLE 2

Cone Compound Electrode Type

| Offset Length | Specific Embodiment 9 type 9 | Specific Embodiment 10 type 10 | Specific Embodiment 11 type 12 | Specific Embodiment 12 type 13 | Specific Embodiment 13 type 14 | Specific Embodiment 14 type 15 | Specific Embodiment 15 type 16 | Specific Embodiment 16 type 17 |
|---|---|---|---|---|---|---|---|---|
| Opening offset length (d3)mm | 2.0 | 2.0 | 2.0 | 2.0 | 2.0 | 5.0 | 8.0 | 12.0 |
| Neck portion offset length (d2)mm | 6.2 | 6.2 | 7.1 | 6.8 | 6.2 | 8.5 | 10.5 | 13.4 |
| Body portion offset length (d1)mm | 1.75 | 2.75 | 2.75 | 1.75 | 2.75 | 2.75 | 2.75 | 2.75 |
| Material | Al | Al | Al | Al | Al | Al | Al | Al |

TABLE 3

| Offset Length | Cylindrical Electrode Comparative Example 1 | Similar Shaped Electrode Comparative Example 2 |
|---|---|---|
| Opening offset length (d3) mm | 2.0 | 1.5 |
| Neck portion offset length (d2) mm | 15.8 | 1.0 |
| Body portion offset length (d1) mm | 1.0 | 1.0 |
| Material | Al | Al |

Eight standards of the neck portion offset are prepared from 6.2 mm to 13.4 mm, and four standards of the body portion offset are prepared. The electrodes formed with these standard offset lengths were assembled to form container side electrodes. Further, in the present embodiments, Al is used as the material of the electrodes, but it is clear that the same electrode improvement results can be obtained using SUS or another metal.

The method of evaluating the DLC film is as follows. The oxygen permeability of the container was measured under the conditions 23° C. and 90% RH using an Oxtran 2/20 manufactured by Modern Control Company, and measurement values were recorded after 20 hours from the start of nitrogen gas replacement.

The film thickness of the DLC film was measured using a DEKTAK 3 made by Veeco Company.

The evaluation of the color of the plastic container is indicated by the coloration degree b* value. The b* value is the color difference of JISK 7105-1981, and is calculated by Equation 6 from the tristimulus values X, Y and Z.

$$b^* = 200[(Y/Y_0)^{1/3} - (Z/Z_0)^{1/3}] \quad \text{(Equation 6)}$$

A U-3500 Model automatic recording spectrophotometer manufactured by Hitachi provided with a 60Φ integrating sphere attached apparatus (for infrared near visible infrared) manufactured by the same company was used. An ultrahigh sensitivity photomultiplier (R928: for visible ultraviolet) and a cooling type PbS (for the near infrared region) were used. As for the measurement wavelengths, the transmittance was measured in the range from 240 nm to 840 nm. By measuring the transmittance of the PET container, it is possible to calculate the transmittance measurement of only the DLC film, but the b* value of the present embodiments as is shows a calculation in a form that includes the absorptance of the PET container. The correlation with b* in the present invention that depends on a visual observation is approximately as shown in Table 4. The b* value of an unprocessed PET container is within the range 0.6~1.0. Further, when the b* value is 2 or less, the container can be said to be colorless and transparent. The approximate correlation with the b* value difference (Δb* value) that depends on the visual observation is shown in Table 5. In order to satisfy the recycle standard, it has been determined that b* should be 6 or less, and preferably 5 or less.

TABLE 4

| | b* Value | | | |
|---|---|---|---|---|
| | 0-2 | 2-4 | 4-6 | 6-8 | 8- |
| Expression by Visual Observation | Colorless | Very light yellowish brown color | Light yellowish brown color | Slightly yellowish brown color | Dark yellowish brown color |

TABLE 5

| | Δb* Value | | | |
|---|---|---|---|---|
| | 0-1 | 1-1.5 | 1.5-3 | 3-6 | 6-12 |
| Expression by Visual Observation | Almost No difference | Very little difference | Small defference | Different | Very different |

In the present embodiments, the film forming conditions of the DLC film were set in accordance with Manufacturing Method 1. At this time, except when specifically stated otherwise, the high frequency power source output was 400 W, the flow rate of acetylene which was the source gas was 40 ml/min, and the film forming time was set at 2 seconds. The film thickness of the DLC film was approximately 30 nm (average for the entire container).

Figure 15:
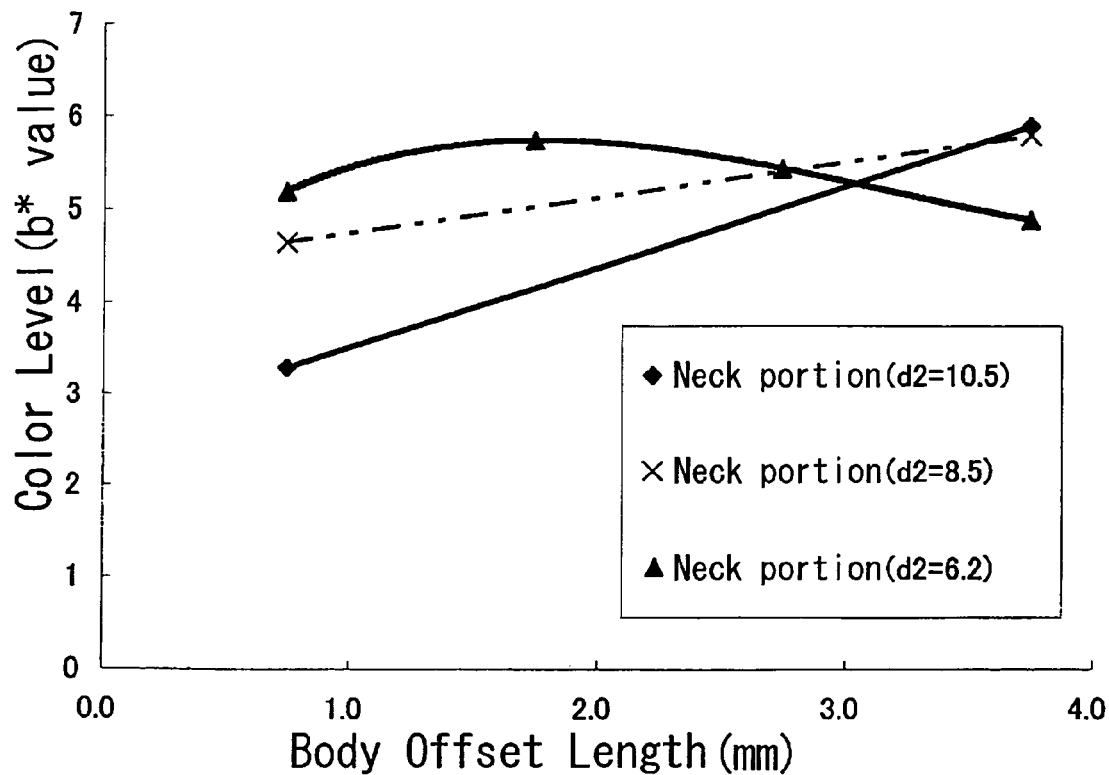
FIG. 15 is a graph which shows the body portion offset length dependence of the b* value.
Figure 16:
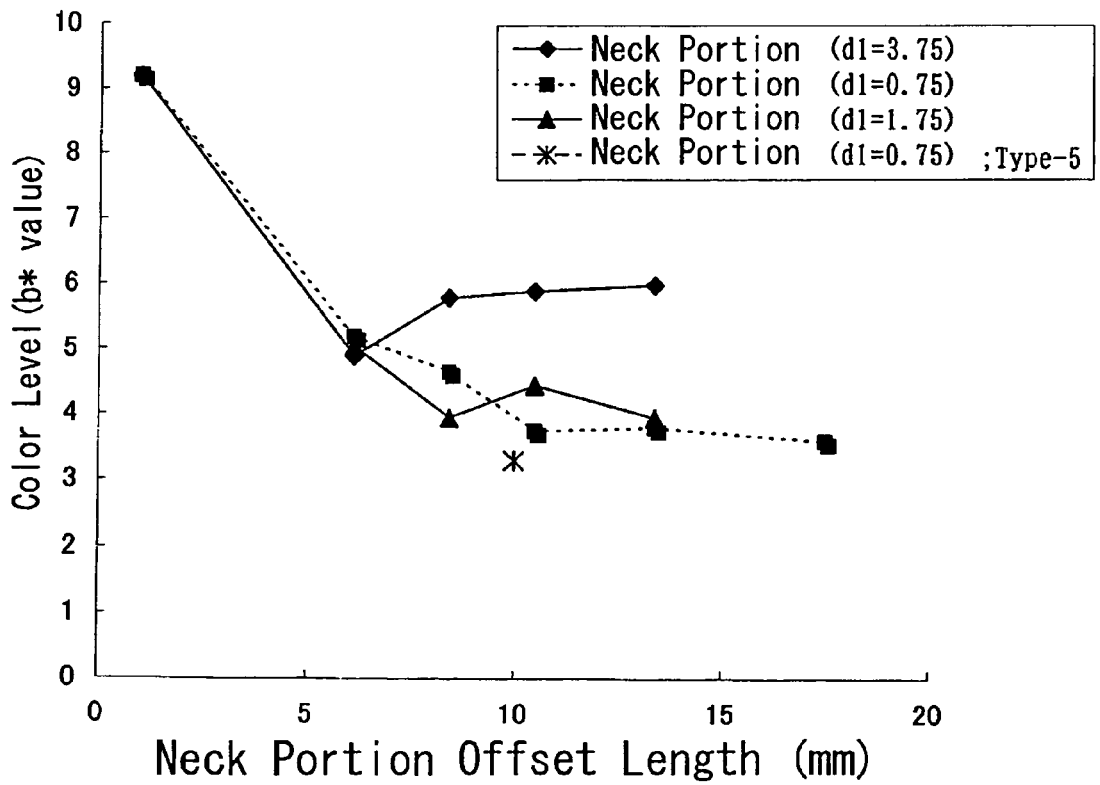
FIG. 16 is a graph which shows the neck portion offset length dependence of the b* value.

By assembling the 16 types shown in Table 1 and Table 2, a film was formed under the conditions described above. The body portion offset length dependence of the oxygen permeability that depends on the difference in electrode structure is shown in FIG. 13, the neck portion offset length dependence of the oxygen permeability that depends on the difference in electrode structure is shown in FIG. 14, the body portion offset length dependence of the b* value that depends on the difference in electrode structure is shown in FIG. 15, and the neck portion offset length dependence of the b* value that depends on the difference in electrode structure is shown in FIG. 16.

(Oxygen Barrier Property of Container)

Figure 13:
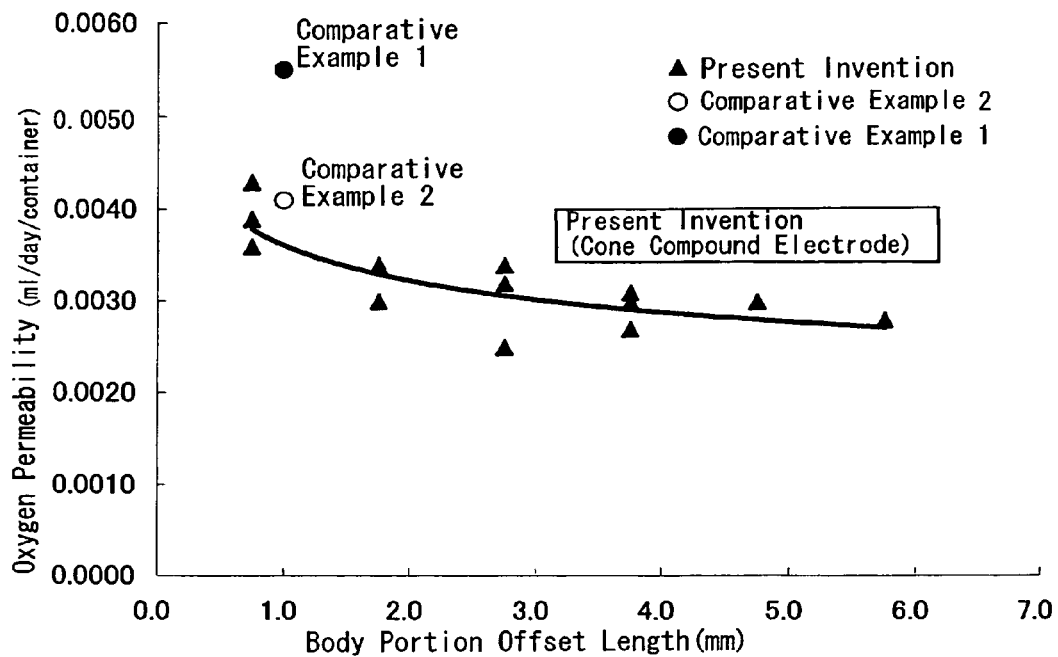
FIG. 13 is a graph which shows the body portion offset length dependence of the oxygen permeability.

With reference to FIG. 13, under the same film forming conditions, the oxygen permeability becomes higher (the oxygen barrier property becomes lower) as the body portion offset length becomes shorter. This is due to an increase in plasma damage caused by stronger ionic collisions due to the fact that the plasma density distribution that concentrates at the neck portion increases the plasma damage due to the working of the small distribution at the body portion side and makes the sheath potential become large and deep. However, a prescribed oxygen barrier property was satisfied. The container manufactured by the cylindrical electrode of Comparative Example 1 had a low oxygen barrier property compared with the containers manufactured by the present invention.

Figure 14:
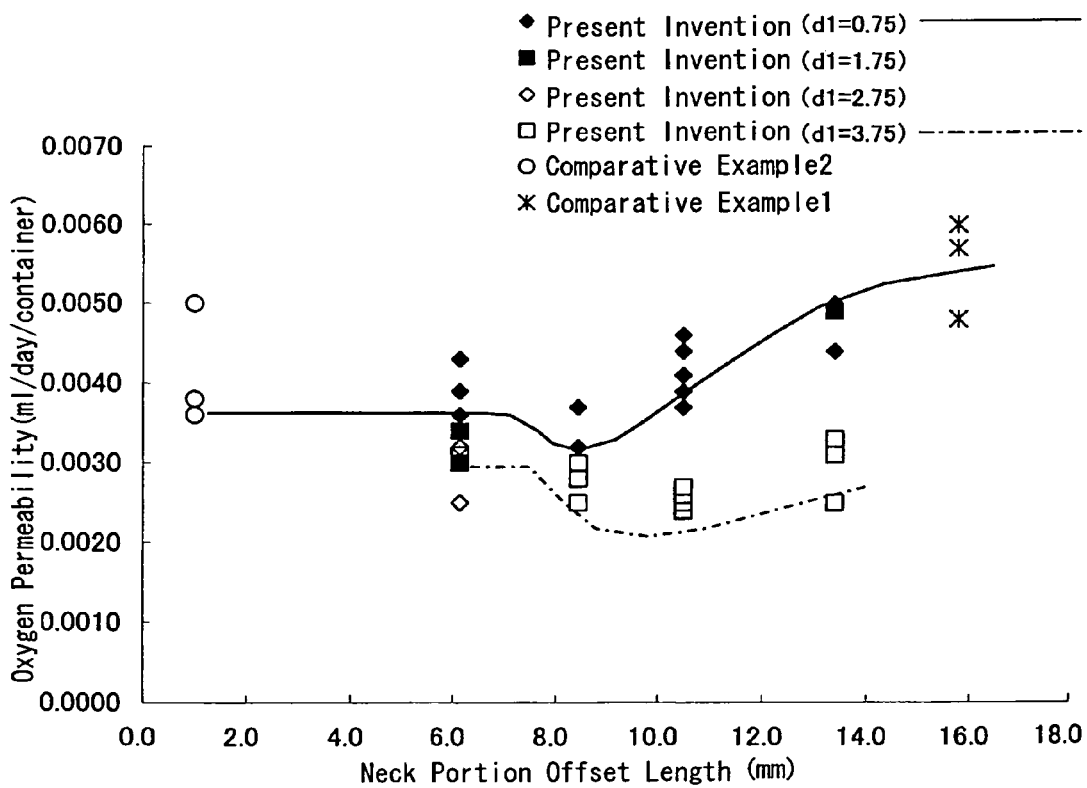
FIG. 14 is a graph which shows the neck portion offset length dependence of the oxygen permeability.

With regard to the neck portion offset length dependence, with reference to FIG. 14, under the same film forming conditions, the oxygen barrier property becomes lower as the body portion offset length becomes shorter. However, for all the body portion offset lengths, the oxygen barrier property of the entire container satisfied a prescribed standard for neck portion offset lengths up to 13.4 mm. In the case of the cylindrical electrode of Comparative Example 1, the barrier property was low, and the prescribed standard was not satisfied. Further, from the results of Raman analysis, it was understood that the DLC film of the neck portion of Comparative Example 1 was a sparse film having few diamond structures, and the DLC film of the neck portion of Specific Embodiment 1 was a fine film that included a relatively large number of diamond structures. Accordingly, in order to form a fine DLC film, the neck portion offset length needs to be adjusted to an optimum length to change the self bias and form an optimum sheath potential. To summarize the above, ranges in which the body portion offset length is 5.75 mm or less and the neck portion offset length is 13.4 mm or less are obtained from the oxygen permeability.

(Coloration of Container)

On the one hand, with regard to the color degree b* value of the film, with reference to the body portion offset length dependence of FIG. 15, except for one portion of data, there is a tendency for the b* value to increase as the body portion offset length increases. From this fact, at the least the body portion offset length needs to be 4 mm or less. The reason for this dependency is that because the effective potential applied to the body portion of the container and the facing electrode is lowered when the body portion offset length is increased, the plasma distribution undergoes further movement to the neck portion from the body portion, and because the plasma distribution becomes more concentrated at the neck portion, it is assumed that the conditions approach the conditions of the prior art technology, whereby the color of the film becomes dark. Further, when the data of the neck portion offset length dependency of FIG. 16 is examined, the color degree b* value becomes larger as the neck portion offset length is reduced in the range where the neck portion offset length is short. This is because plasma concentration at the neck portion becomes more remarkable as the electrode structure approaches Comparative Example 2. On the other hand, when the neck portion offset length at the place where the b* value shows a minimum value is exceeded, the b* value increases, and before long shows a tendency to become saturated. This is assumed to be caused by degradation of the film quality (bonding structure and the like) due to the lowering of the self bias which makes the ionic collisions at the time of film formation become smaller when the effective voltage applied to the container and the facing electrode is reduced accompanying the increase of the neck portion offset length.

(Examination of Relationship between Oxygen Barrier Property of Container and Coloration of Neck Portion)

Figure 17:
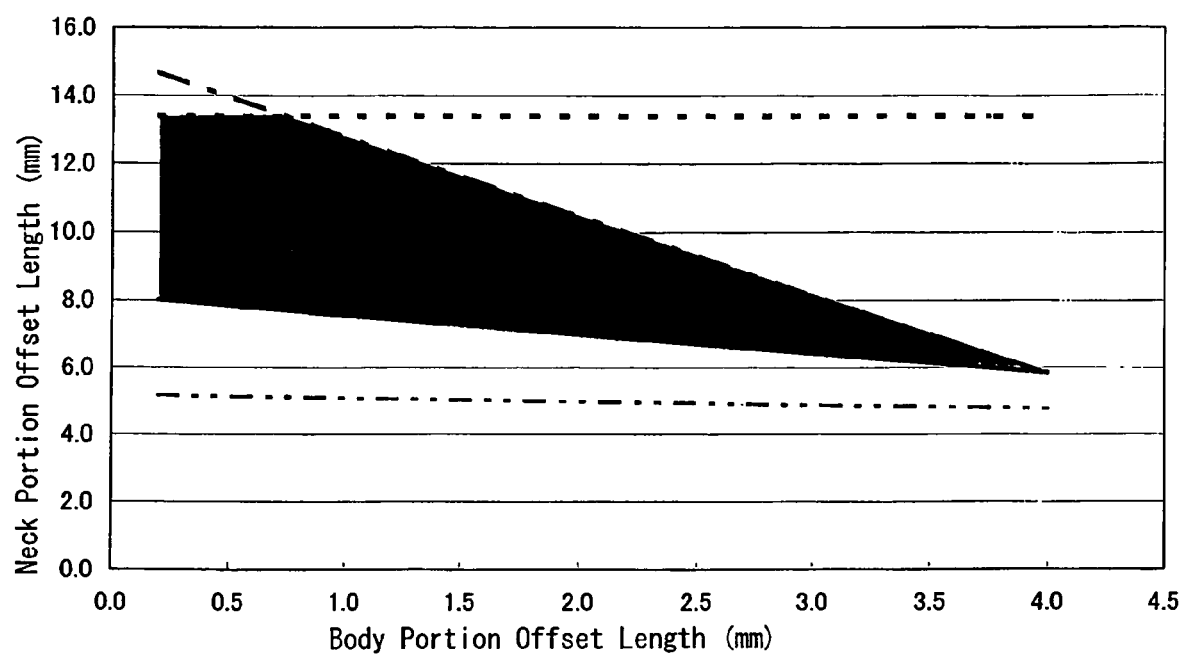
FIG. 17 is a drawing which shows the relationship of the optimum offset length.

From the data of the oxygen barrier property and the coloration given above, the range of the body portion offset length and the neck portion offset length forms the range (blackened portion) shown in FIG. 17. Namely, when the body portion offset length is less than or equal to 4 mm from the color data, the neck portion offset length changes depending on the body portion offset length. For example, in the case where the body portion offset length is 0.2 mm, the neck portion offset length is greater than or equal to 8.0 mm and less than or equal to 13.4 mm, and in the case where the body portion offset length is 4.0 mm, the neck portion offset length becomes 5.9 mm.

In order to represent this mathematically, an offset coefficient K is introduced. In the case of the containers of the present embodiments, the correlation between the neck portion offset length and the body portion offset length can be prescribed by the equation given below.

$$d2 = K \times (D1-D2)/2 + d1 \quad \text{(Equation 1)}$$

When K is zero, this represents the cylindrical electrode of Comparative Example 1, and when K is 1, this represents the similar electrode of Comparative Example 2. By introducing this kind of offset coefficient K, it is possible to obtain the electrode design value of the present invention.

The offset coefficient from FIG. 17 and Equation 1 is as follows.

$$0.29 \leq K \leq 0.79 \text{ where } 0.2 \text{ mm} \leq d1 \leq 2.0 \text{ mm} \quad \text{(Equation 2)}$$

$$0.11 \leq K \leq 0.51 \text{ where } 2.0 \text{ mm} < d1 \leq 4.0 \text{ mm} \quad \text{(Equation 3)}$$

(Introduction of Container Compensation Coefficient α)

The present invention can be applied even in the case of a container in which the body portion and the neck portion have different dimensions. With regard to the shape of the container, in order to show that the present invention can be applied to other shapes, the constant α is introduced to give container dependence to Equation 1. In view of the change in plasma density that depends on the change in size of the neck portion, the degree of plasma concentration at the neck portion is represented by the ratio of the body portion average cross-sectional area and the neck portion average cross-sectional area of the container.

$$\alpha = (D1/D2)^2/3.54 \quad \text{(Equation 5)}$$

By introducing this equation in Equation 1, the following is obtained.

$$d2 = \alpha K \times (D1-D2)/2 + d1 \quad \text{(Equation 4)}$$

In the present embodiments, $(D1/D2)^2 = 3.54$, and because this gives α=1, Equation 4 becomes the same equation as Equation 1.

(Comparison of Prior Art DLC Film Having Large b* Value and DLC Film Having Small b* Value Obtained by Apparatus of Present Invention)

Figure 18:
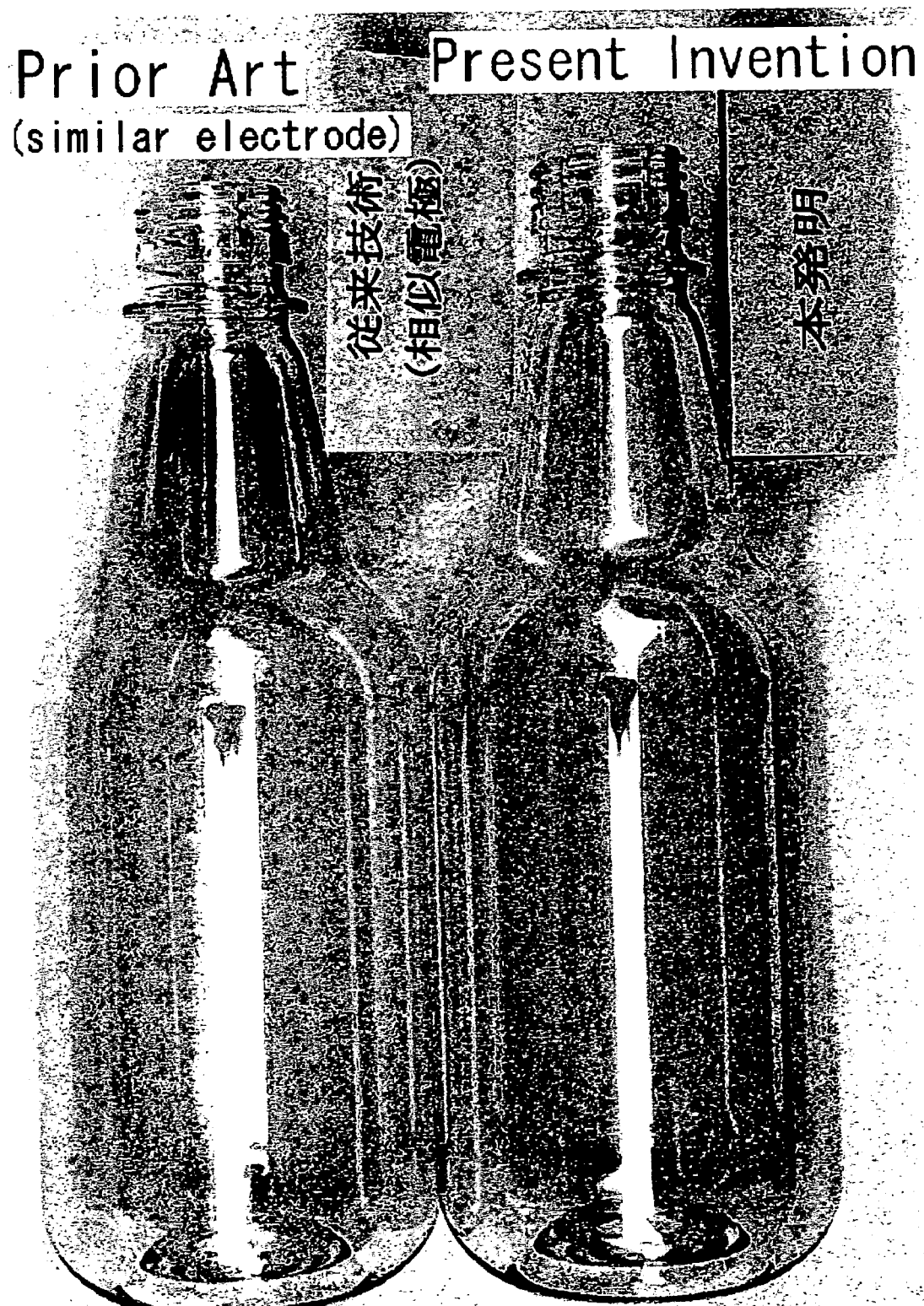
FIG. 18 is a picture which shows a comparison of a DLC film container (mentioned as present invention) obtained by the manufacturing apparatus of the present invention and a DLC film container obtained by a prior art manufacturing apparatus in which the inner wall of the space of the container side electrode housing the container has a shape similar to the container outer wall.

The DLC film of the shoulder portion obtained by the manufacturing apparatus of the present invention has a small b* value compared with the DLC film of the shoulder portion obtained by a prior art manufacturing apparatus in which the inner wall of the space of the container side electrode housing the container has a similar shape, and there is clearly a difference even when a comparison is carried out by visual observation. In order to show this comparison, FIG. 18 shows a picture in which both containers are compared. Further, the case of the manufacturing apparatus of the present invention is mentioned as present invention, and the case of the manufacturing apparatus having a similar shaped electrode is mentioned as prior art technology. In the container of the present invention, the body portion and the neck portion appear to have roughly the same color, there is little irregular color, and such color is light. On the other hand, in the container of the prior art technology, the color of the neck portion is darker than the color of the body portion, and there is irregular color.

Figure 19:
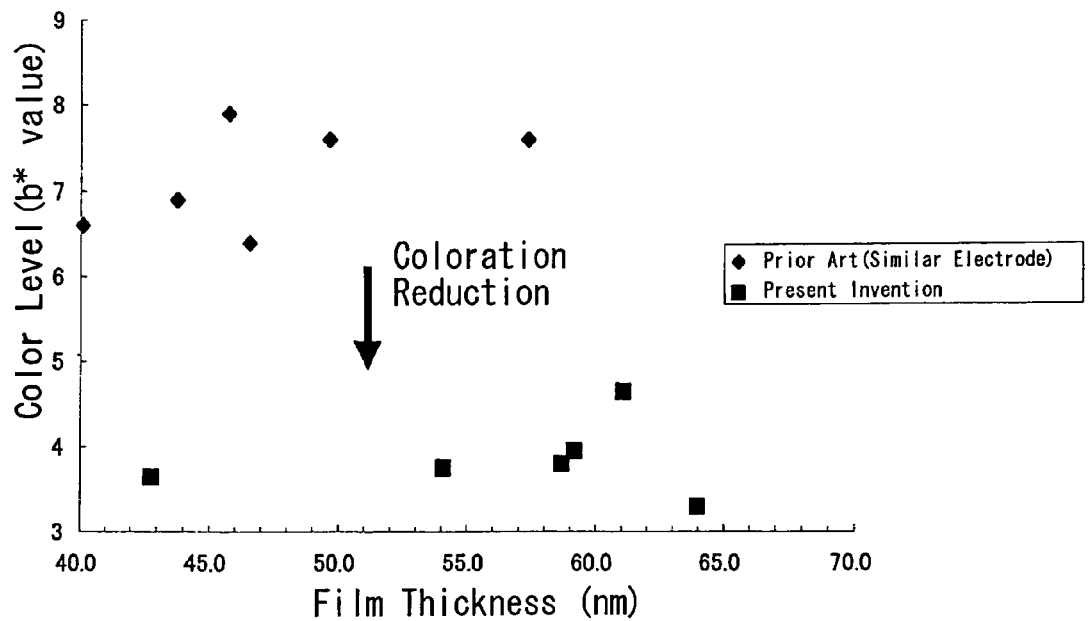
FIG. 19 is a drawing which shows the relationship between the film thickness of the DLC film and the b* value.
Figure 20:
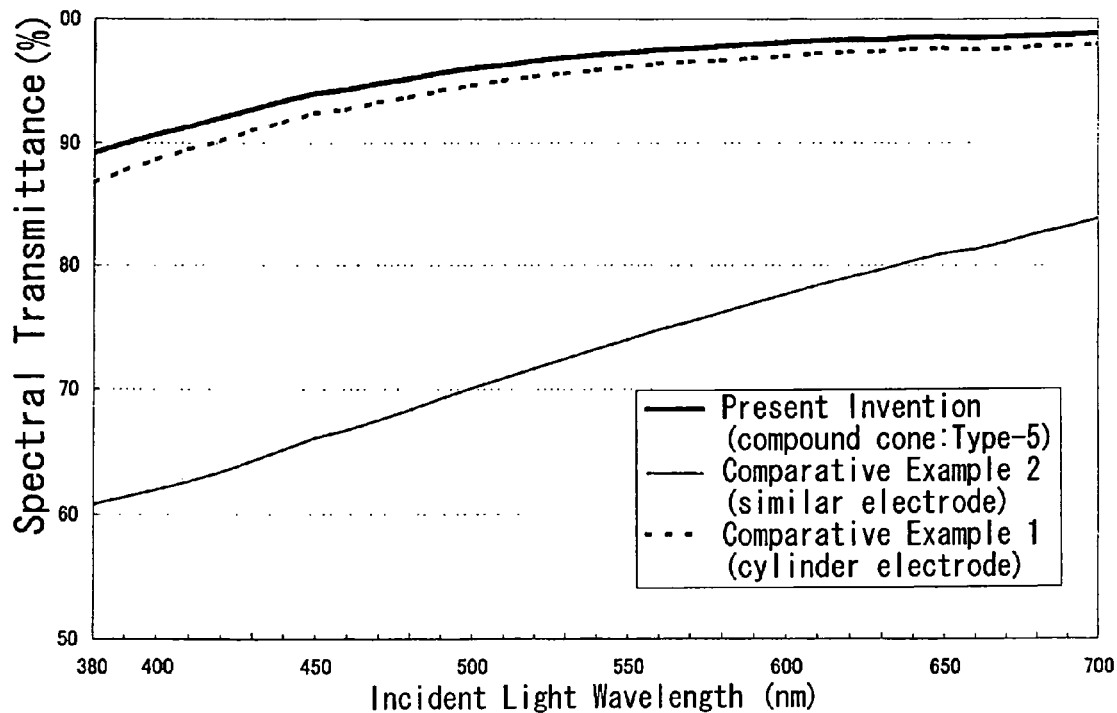
FIG. 20 is a graph which shows the difference in transmittance spectrum properties of DLC film containers which depend on the electrode structure.

It became clear that the light color of the DLC film formed on the neck portion of the present invention is not due a thin film thickness. The correlation of the film thickness and the b* values is shown in FIG. 19. Places having a dark color formed the measurement places. The container of the present invention was shown to have small b* values regardless of the film thickness. In this regard, FIG. 20 shows the optical transmittance property at the same portions. The data of the graph is the optical transmittance property of only the DLC film in which the effects of the PET base material were eliminated. It was understood that the container of the present invention has a slightly higher optical transmittance property than the container of Comparative Example 1. Further, in contrast with the container of the present invention which has a prescribed oxygen barrier property, the container of Comparative Example 1 did not achieve the prescribed oxygen barrier property. From the results of Raman analysis, it was understood that the film quality is degraded (the proportion of diamond bonding is very small).

Figure 21:
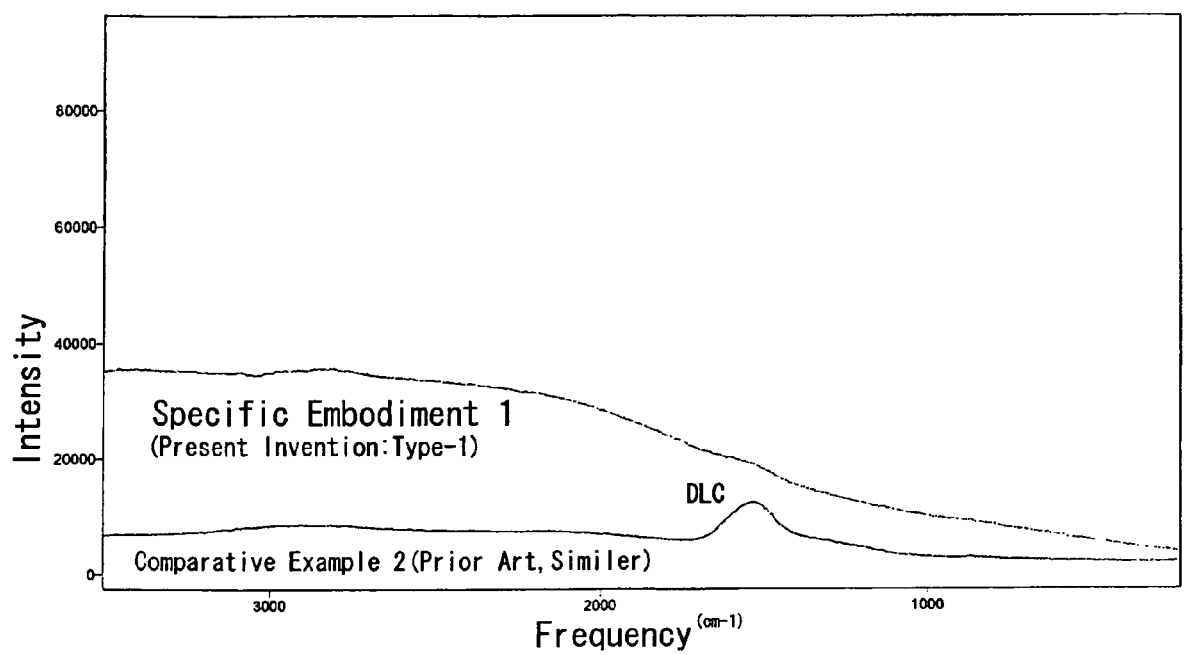
FIG. 21 is a graph which shows a comparison of the Raman spectrums of the container of the present invention and the container of Comparative Example 2 (prior art technology).
Figure 22:
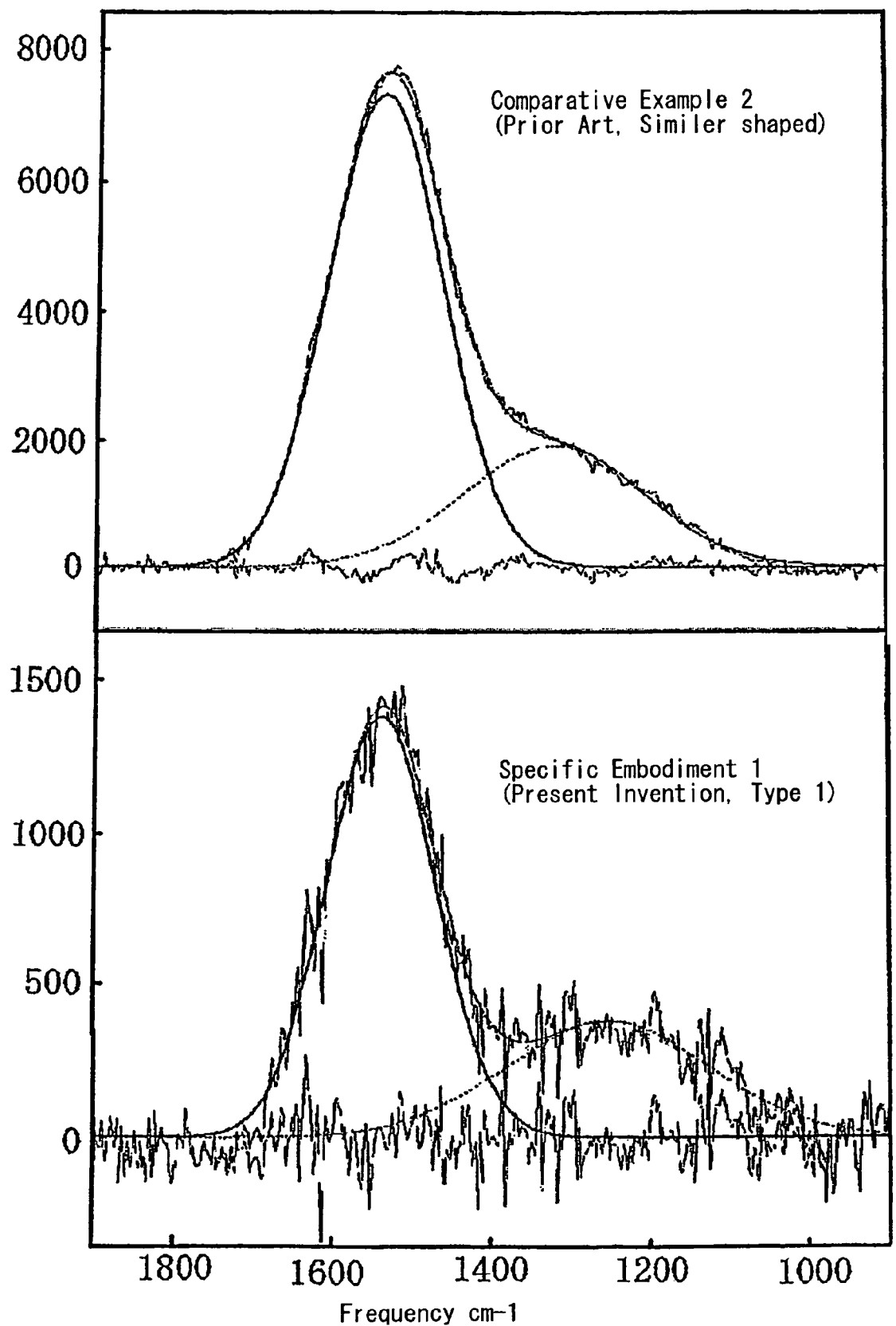
FIG. 22 shows enlarged views of the DLC related portions after the effects due to fluorescence are eliminated in FIG. 21.

Further, a comparison of the Raman spectrums of the container of the present invention and the container of Comparative Example 2 (prior art technology) is shown in FIG. 21, and enlarged views of the DLC related portions after the effects due to fluorescence were eliminated are shown in FIG. 22. As for the Raman spectrum, a Super Labram manufactured by Jobin Yvon Company was used.

FIG. 21 shows the Raman scattering spectrums (in which the peak of the PET base is subtracted) of Specific Embodiment 1 and Comparative Example 2. The writing of DLC in the graph represents a graphite structure peak. Because there is almost no observation of a diamond structure peak by Raman, a form in which evaluation is indirectly carried out from the intensity of the graphite band or the like is formed. From the spectrum of Specific Embodiment 1 of the present invention, it is understood that Comparative Example 2 is the one in which the graphite peak intensity is large and the graphite mixing proportion or the proportion of carbon (hereafter written as C) double bonds is large. This is assumed to form the cause of coloration.

FIG. 22 shows enlarged views of the spectrums. As for the graphite band, the G band and the D band are observed, and the D band of the lower wave number side is a band that signifies Disorder and reveals the graphite crystal property will be destroyed. The appearance of the D band is believed to correspond to the fact that DLC exists in the film and the graphite crystal property is being destroyed. In the DLC film, there exists a mixing of $sp^2$ structures and $sp^3$ structures. The D band described above does not appear in the composition region where the proportion of DLC is very small in contrast with the graphite described above, and conversely when the proportion of DLC increases, there is a tendency for the intensity to be reduced again accompanying the increase in the abundance ratio of $sp^3$ structures (diamond bonding and C—H bonding) in the DLC film. In the regions of Specific Embodiment 1 and Comparative Example 2, the intensity of the D band is weak, but the proportion of $sp^3$ structures is high, and this represents a high proportion of diamond bonding and C—H bonding. In the enlarged views, the graphite bands (G band and D band) appear even in the present embodiments, but from an intensity comparison of the vertical axis, and from the fact that noise is included in the shape of the spectrum and the fact that both the G band and the D band are weak, it is understood that the graphite mixing proportion is low and the ratio of $sp^3$ bonding is high. Conversely, in Comparative Example 2, it is understood that the peak intensity of the G band is 5.3 times higher compared to the DLC film of Specific Embodiment 1, and the graphite mixing proportion is high.

Accordingly, this increase in the proportion of graphite mixing and carbon double bonds is assumed to make the coloration of the container neck portion darker.

From the b* value and the results of the Raman spectrums, it became clear that the DLC film formed on the container neck portion of the present invention and the DLC film formed on the container neck portion of the prior art technology are DLC films having different film qualities (C bonding states and the like). In the apparatus of the present invention, there are few graphite type carbon $sp^2$ bonding structures, and because it is possible to form a fine DLC film having a high proportion of $sp^3$ bonding structures (diamond structures and the like) on the container neck portion (and body portion), it is possible to manufacture a container having a light uniform color over the entire container while securing an oxygen barrier property.

(Examination of Carbon Atom Content, Hydrogen Atom Content and Amount of Graphite Type Bonding of Film)

The carbon atom content and the hydrogen atom content in the container neck portion of specific embodiments 1, 2, 3 and 5 and comparative examples 1 and 2 are shown in Table 6. In this regard, scaling is carried out so that the carbon atom content and the hydrogen atom content form a total of 100. The measurement device used a RBS (Rutherford backward scattering analyzer) and a HFS (hydrogen forward scattering measurement apparatus). The accelerator was a 5SDH2 manufactured by National Electronics Corporation, the measurement system was a RBS400 manufactured by Charls Evans and Associates, and the RBS and the HFS were used together.

the present embodiments, it is possible for the DLC film formed on the neck portion to have higher hydrogen atom content than the DLC film formed on the body portion.

Further, in Comparative Example 1, the carbon atom content and the hydrogen atom content in the container neck portion were the same as those of Comparative Example 2, but the oxygen barrier property was low as described above, and a prescribed standard was not satisfied.

Next, comparisons of the content of graphite type bonding ($SP^2$) in the container neck portion and the container body portion of specific embodiments 1, 2, 3 and 5 and comparative examples 1 and 2 are shown in Table 7. The comparisons were carried out by conversion to the amount of graphite type bonding per each film thickness. The amount of graphite type bonding was measured using an ESR (electron spin resonance analyzing apparatus, JES-FE2XG, manufactured by JEOL).

As is understood from Table 7, the DLC film formed on the neck portion has a lower graphite mixing proportion than the DLC film formed on the body portion. Namely, the graphite mixing proportion of the DLC film formed on the neck portion is 5~18% of the graphite mixing proportion of the body portion.

TABLE 6

|  | Specific Embodiment 1 | Specific Embodiment 2 | Specific Embodiment 3 | Specific Embodiment 5 | Comparative Example 1 | Comparative Example 2 |
| --- | --- | --- | --- | --- | --- | --- |
| Carbon Content of Neck portion (atom %) | 37 | 48 | 39 | 43 | 48 | 55 |
| Hydrogen Content of Neck portion (atom %) | 63 | 52 | 61 | 57 | 52 | 45 |

The composition proportion of carbon and hydrogen (carbon atom/hydrogen atom) of the DLC film formed on the neck portion was 37/63~48/52. In this regard, there is no difference between the specific embodiments and the comparative examples with regard to the body portion carbon content and the body portion hydrogen content, wherein the body portion carbon content was 55~75 atom %, and the body portion hydrogen content was 25~45 atom %. Accordingly, in In Comparative Example 2, the amount of graphite type bond mixing of the neck portion and the body portion are the same level. Accordingly, there is more coloration of the neck portion as the thickness of the neck portion becomes larger. In the embodiments, because the amount of graphite type bond mixing is small, it is possible to prevent coloration even when the thickness of the neck portion becomes large.

TABLE 7

|  | Specific Embodiment 1 | Specific Embodiment 2 | Specific Embodiment 3 | Specific Embodiment 5 | Comparative Example 1 | Comparative Example 2 |
| --- | --- | --- | --- | --- | --- | --- |
| Amount of Graphite like bonding of Neck portion | 0.38 | 0.31 | 0.38 | 0.12 | 0.14 | 1.00 |
| Film thickness of Neck portion (nm) | 62.9 | 62.7 | 67.2 | 64.0 | 47.4 | 53.0 |
| A: Amount of Graphite like bonding/film thickness | 0.0060 | 0.0049 | 0.0057 | 0.0019 | 0.0030 | 0.0019 |
| Amount of Graphite like bonding of Body portion | — | — | — | 0.40 | — | 0.25 |
| Film thickness of Body portion (nm) | 12.3 | 10.9 | 11.6 | 11.5 | 11.8 | 15.0 |

TABLE 7-continued

| | Specific Embodiment 1 | Specific Embodiment 2 | Specific Embodiment 3 | Specific Embodiment 5 | Comparative Example 1 | Comparative Example 2 |
|---|---|---|---|---|---|---|
| B: Amount of Graphite like bonding/film thickness | — | — | — | 0.0348 | — | 0.0167 |
| A/B, where B is Data of Specific Embodiment 5 | 17.4 | 14.2 | 16.3 | 5.4 | — | — |
| A/B, where B is Data of Comparative Example 2 | — | — | — | — | 8.5 | 113.2 |

As described above, in the DLC film coated plastic containers of the present embodiments, the DLC film formed on the neck portion has a lower proportion of graphite mixing and a higher hydrogen atom content than the DLC film formed on the body portion. Moreover, the oxygen permeability of the container was ensured to be less than or equal to 0.0050 ml/container (500 ml PET container)/day (23° C. and RH 90%, measurement values after 20 hours from the start of nitrogen gas replacement).

(Examination of Container Manufactured by Manufacturing Method 3)

A PET bottle having an axial symmetrical shape with respect to the central axis of the vertical direction of the container was used as the plastic container. The plastic container used in the present embodiments is a PET container having a capacity of 500 ml, a container height of 200 mm, a container body portion diameter of 71.5 mm, a mouth portion opening inner diameter of 21.74 mm and outer diameter of 24.94 mm, a container body portion thickness of 0.3 mm, and a resin weight of 32 g/container of polyethylene terephthalate resin (RT553, PET resin manufactured by Nihon Yunipet (Inc.)).

The apparatus used by the present embodiments is the apparatus shown in FIG. 24. This is a manufacturing apparatus which uses a similar shaped electrode. FIG. 24 shows a manufacturing apparatus in the case where SUS is used as an internal electrode which also functions as a gas inlet pipe.

Coating was carried out according to the conditions described in Manufacturing Method 3. The sequence of Manufacturing Method 3 is shown in FIG. 23. In FIG. 23(*a*), the air inside the container is sufficiently exhausted by the vacuum pump in the state where a butterfly valve is open 100% to secure a vacuum level of 2 Pa. Next, in FIG. 23(*b*), the opening of the butterfly valve is made 0% or is made smaller, and source gas is introduced. The inside of the container is sufficiently filled with source gas, and the pressure is made uniform at 20~50 Pa. Next, in FIG. 23(*c*), a high frequency is applied, the source gas is converted to plasma, and the container inner wall surface is coated with a DLC film. Next (not shown in the drawing), the supply of source gas is stopped, the butterfly valve opening is returned to 100%, the vacuum valve is stopped, and air is introduced inside the container. This formed Specific Embodiment 17.

In the container of Specific Embodiment 17 manufactured by the processes described above, the average thickness (average for the entire container) of the DLC film was 25 nm, and the b* value of the container neck portion was 3.8, and this made it possible to manufacture a container having a light uniform color over the entire container. Further, the same results were obtained even when the electrode (an electrode in which the neck portion offset length is larger than the body portion offset length) of the present invention shown in FIG. 4 was used.

Further, using the apparatus of FIG. 4, a container was manufactured according to Manufacturing Method 2. This forms Specific Embodiment 18. In the container of Specific Embodiment 18, it was possible to form a light color DLC film on the container neck portion in the same way as in Specific Embodiment 17. It was possible to manufacture a container having a light uniform color over the entire container while ensuring an oxygen barrier property. Further, the same results were obtained by the apparatus shown in FIG. 24.

A container was manufactured in accordance with Manufacturing Method 3 using the manufacturing apparatus in the case where a tube made of fluororesin is used as the source gas inlet pipe 9 in the apparatus shown in FIG. 3 in which the mouth side electrode 5 is arranged outside the container. This forms Specific Embodiment 19. In the container of Specific Embodiment 19, it was possible to form a light color DLC film on the container neck portion in the same way as in Specific Embodiment 17. It was possible to manufacture a container having a light uniform color over the entire container while ensuring an oxygen barrier property. Further, the same results were obtained even by the apparatus in which the container side electrode in the apparatus of FIG. 3 is formed as a similar shaped electrode.

A container was manufactured in accordance with Manufacturing Method 2 using the manufacturing apparatus in the case where a tube made of fluororesin is used as the source gas inlet pipe 9 in the apparatus shown in FIG. 3 in which the mouth side electrode 5 is arranged outside the container. This forms Specific Embodiment 20. In the container of Specific Embodiment 20, it was possible to form a light color DLC film on the container neck portion in the same way as in Specific Embodiment 17. It was possible to manufacture a container having a light uniform color over the entire container while ensuring an oxygen barrier property. Further, the same results were obtained even by the apparatus in which the container side electrode in the apparatus of FIG. 3 is formed as a similar shaped electrode.

Figure 12:
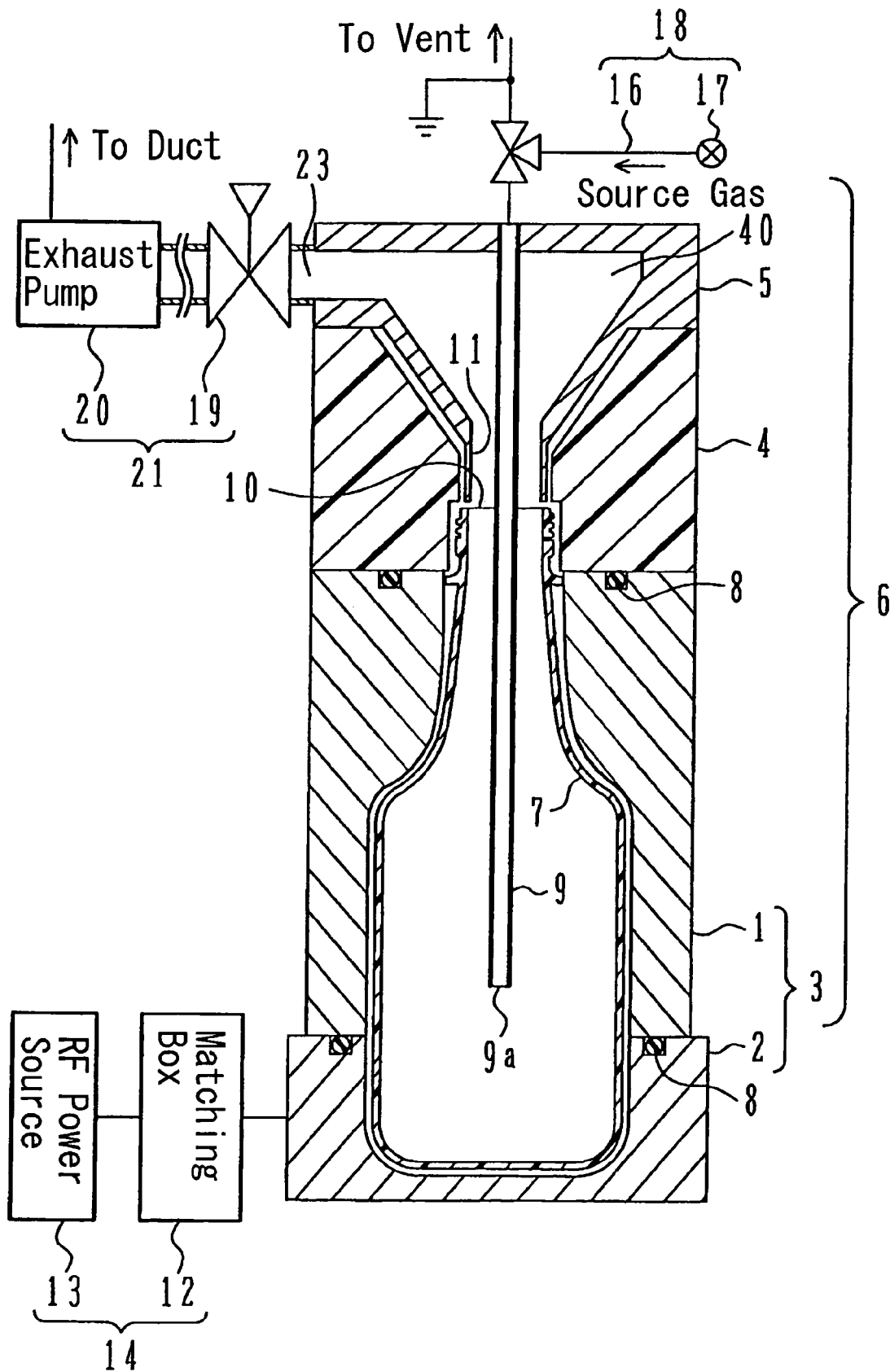
FIG. 12 is a schematic drawing of the case where the container side electrode is given an electrode structure having a shape similar to the container in the apparatus of FIG. 1.

A container was coated with a DLC film to form Specific Embodiment 21 in accordance with the conditions described in Manufacturing Method 2 by the manufacturing apparatus shown in FIG. 12 in which a so-called similar shaped electrode is arranged. Further, a container was coated with a DLC film to form Specific Embodiment 22 in accordance with the conditions described in Manufacturing Method 3 by the manufacturing apparatus shown in FIG. 12 in which a so-called similar shaped electrode is arranged. In the container of either Specific Embodiment 21 or Specific Embodiment 22, it was possible to form a light color DLC film on the container neck portion in the same way as in Specific Embodiment 17. It was possible to manufacture a container having a light uniform color over the entire container while ensuring an oxygen barrier property. Further, the same results were obtained by the apparatus shown in FIG. 1.

A container was coated with a DLC film to form Comparative Example 3 in accordance with the conditions described in Manufacturing Method 1 by the manufacturing apparatus shown in FIG. 12 in which a so-called similar shaped electrode is arranged. The container of Comparative Example 3 had a film thickness (average for the entire container) of 27 nm. The oxygen permeability was 0.0045 ml/container (500 ml PET container)/day (23° C. and RH 90%, measurement values after 20 hours from the start of nitrogen gas replacement), and the $b^*$ value was 9.2. Accordingly, the container secured an oxygen barrier property but had irregular color that created coloration in the neck portion.

When specific embodiments 17~22 and Comparative Example 3 are compared, Manufacturing Method 2 and Manufacturing Method 3 are manufacturing methods which make it possible to manufacture a container having a light uniform color over the entire container while securing an oxygen barrier property by reducing degradation due to plasma damage or plasma etching of the DLC film at the neck portion even when applied to either the apparatus in the present invention or the prior art apparatus in which a similar shaped electrode is arranged.

The invention claimed is:

1. A DLC film coated plastic container, comprising:
a plastic container having a DLC film formed on the inner wall surface thereof, wherein the cross-sectional area of an opening of said container is made smaller than the cross-sectional area of a horizontal cross section at a body portion of said container and a neck portion is provided between said opening and said body portion;
wherein the DLC film formed on said neck portion has a higher hydrogen atom content than the DLC film formed on said body portion, the oxygen permeability of said container is less than or equal to 0.0050 ml/container (500 ml PET container)/day (23° C. and RH90%, measurement values after 20 hours from the start of nitrogen gas replacement), the film thickness of the DLC film formed in the neck and body portion of the inside on said container is 10.9~67.2 nm the composition proportion of carbon and hydrogen (carbon atom/hydrogen atom) of the DLC film formed on said neck portion is equal to or higher than 37/63 but equal to or lower than 43/57, and the composition proportion of carbon and hydrogen (carbon atom/hydrogen atom) of the DLC film formed on said body portion is equal to or higher than 55/45 but equal to or lower than 75/25,
wherein the $b^*$ value of the neck portion is 6 or less, wherein the $b^*$ value includes the absorptance of the PET container.

2. The DLC film coated plastic container described in claim 1, wherein said the DLC formed by an apparatus for manufacturing a DLC film coated plastic container, comprising:
a container side electrode which forms one portion of a pressure-reducing chamber which houses a container formed from a plastic in which the cross-sectional area of an opening of said container is made smaller than the cross-sectional area of a horizontal cross section at a body portion of said container and a neck portion is provided between said opening and said body portion, and a facing electrode which faces said container side electrode and is arranged inside said container or above said opening, wherein said container side electrode and said facing electrode are made to face each other via an insulating body which forms a portion of said pressure-reducing chamber, source gas supply means which supply a source gas that is converted to plasma for coating the inner wall surface of said container with a diamond like carbon (DLC) film includes a supply gas inlet pipe provided in said pressure-reducing chamber in introduce said source gas supplied to said pressure-reducing chamber to the inside of said container, exhaust means which exhaust gas inside said pressure-reducing chamber from above the opening of said container are provided, and high frequency supply means which supply a high frequency is connected to said container side electrode;
wherein said container electrode is formed so that the average inner hole diameter (R2) of the inner wall surrounding said neck portion when the container is housed becomes smaller than the average inner hole diameter (R1) of the inner wall surrounding said body portion, and the average distance (d2) between the outer wall of the said container and the inner wall of said container side electrode in a horizontal cross section with respect to the vertical direction of said container at said neck portion becomes longer than the average distance (d1) between the outer wall of said container and the inner wall of said container side electrode in a horizontal cross section with respect to the vertical direction of said container at said body portion.

3. The DLC film coated plastic container of claim 1, wherein the $b^*$ value is 5 or less.

4. The DLC film coated plastic container of claim 1, wherein the $b^*$ value is 4 to less than 6.

5. The DLC film coated plastic container of claim 1, wherein the $b^*$ value is 2 to 4.

6. The DLC film coated plastic container of claim 1, wherein the $b^*$ value is 0 to 2.

* * * * *

UNITED STATES PATENT AND TRADEMARK OFFICE
CERTIFICATE OF CORRECTION

| | | |
|---|---|---|
| PATENT NO. | : 7,754,302 B2 | Page 1 of 1 |
| APPLICATION NO. | : 10/514728 | |
| DATED | : July 13, 2010 | |
| INVENTOR(S) | : Teruyuki Yamasaki et al. | |

It is certified that error appears in the above-identified patent and that said Letters Patent is hereby corrected as shown below:

On the title page, Item (73) should read: -- (73) Assignee: Kirin Beer Kabushiki Kaisha, Tokyo-to, JP --

Signed and Sealed this

Sixteenth Day of November, 2010

David J. Kappos
*Director of the United States Patent and Trademark Office*